United States Patent [19]
Tanaka

[11] Patent Number: 5,412,541
[45] Date of Patent: May 2, 1995

[54] SPECIFICALLY CONFIGURED SHEET MEMBERS OR ARTICLES FOR USE IN IMPROVING SOUND OR IMAGE QUALITY

[76] Inventor: Tatsuo Tanaka, 2072-294, Kamitsu-machi, Kurume-shi, Fukuoka-ken, Japan

[21] Appl. No.: 165,896
[22] Filed: Dec. 14, 1993

[30] Foreign Application Priority Data

Dec. 18, 1992 [JP] Japan .................. 4-356099
Jul. 14, 1993 [JP] Japan .................. 5-197870
Sep. 10, 1993 [JP] Japan .................. 5-250134
Nov. 4, 1993 [JP] Japan .................. 5-301250

[51] Int. Cl.6 .......................... H05K 9/00
[52] U.S. Cl. .................. 361/818; 174/35 R; 174/35 MS; 257/659; 257/660; 334/85; 333/12
[58] Field of Search .......... 174/35 R, 35 GC, 35 MS, 174/35 TS; 250/515.1; 257/659, 660, 685; 307/91; 330/68; 331/67; 333/12, 246; 334/85; 343/841–844; 358/342, 255; 360/83; 361/816, 818; 439/108, 109, 607, 608, 609

[56] References Cited

U.S. PATENT DOCUMENTS 2,892,135 6/1959 Woods ........................ 257/685
5,329,066 7/1994 Hansson ..................... 174/35 R

FOREIGN PATENT DOCUMENTS 4-303998 10/1992 Japan ..................... 174/35 R

Primary Examiner—Leo P. Picard
Assistant Examiner—D. Sparks
Attorney, Agent, or Firm—Jones, Tullar & Cooper

[57] ABSTRACT

A sheet member adapted for attachment to an acoustic or imaging apparatus to improve the acoustic or imaging performance thereof. The sheet member is generally circular, including a plurality of generally W-shaped cut-outs and a like plurality of generally V-shaped cut-outs both formed alternately and equi-angularly in the outer circumference thereof. The sheet member improves the acoustic or imaging performance by reducing the interference caused by electromagnetic radiations emitted from the acoustic or imaging apparatus or their components to which the sheet member is attached. The reduction of such interference can be attained also by forming a compact disc, a laser disc, a magnetic tape, a semiconductor chip, a circuit board, a magnetic or IC card or the like in a manner to have such cut-outs in their outer circumference.

28 Claims, 22 Drawing Sheets

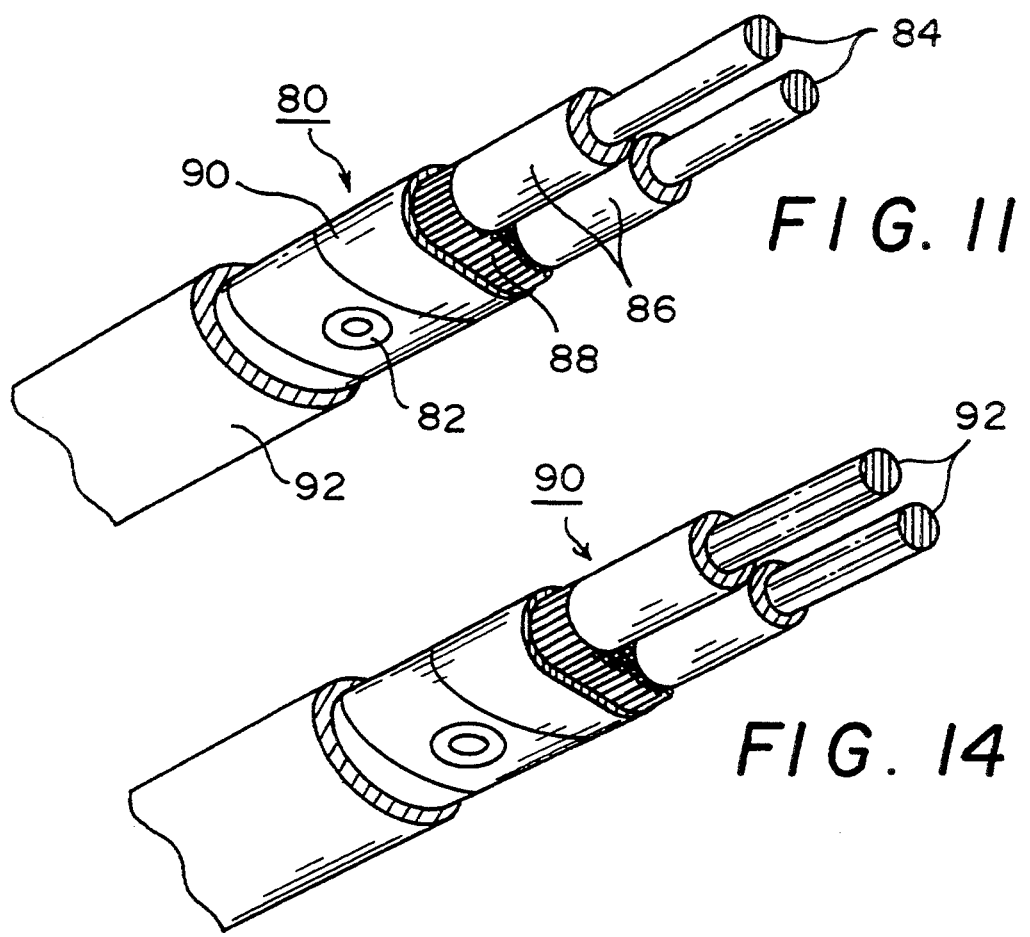
FIG. 11
FIG. 14
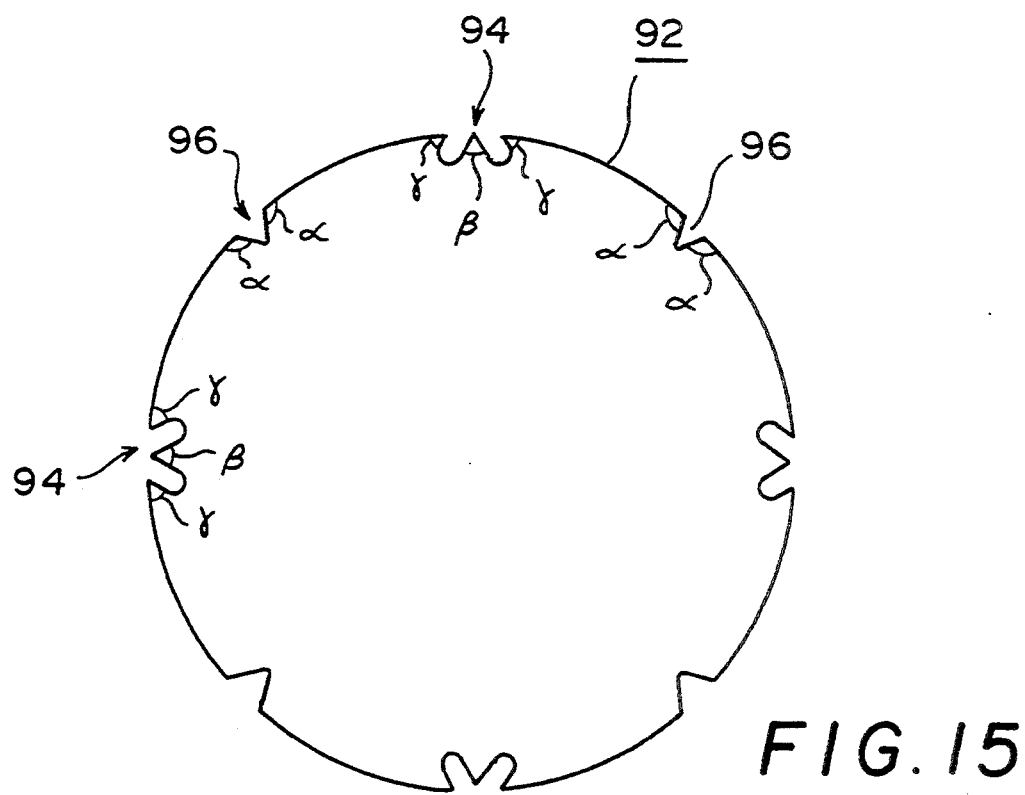
FIG. 15

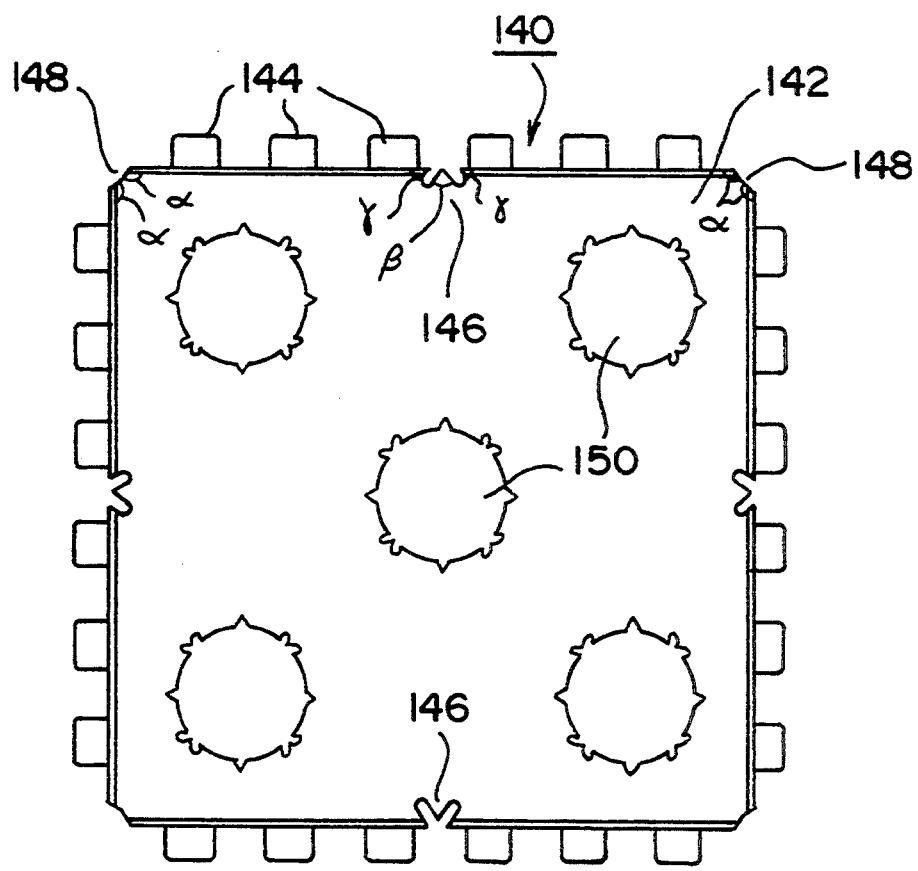
FIG. 19
FIG. 20
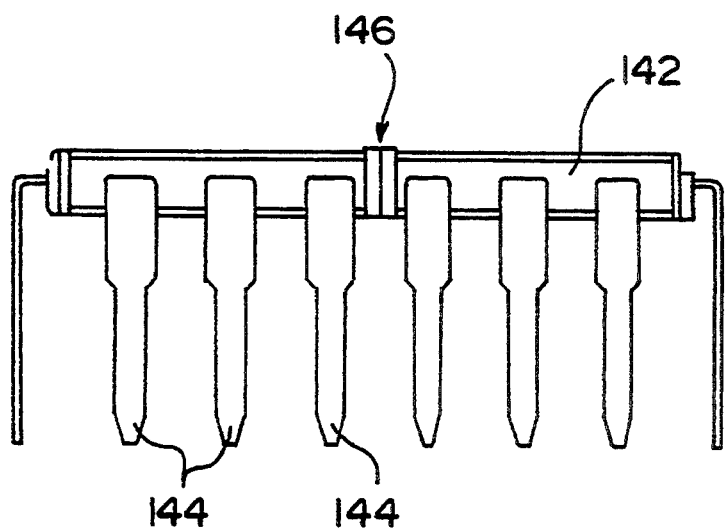

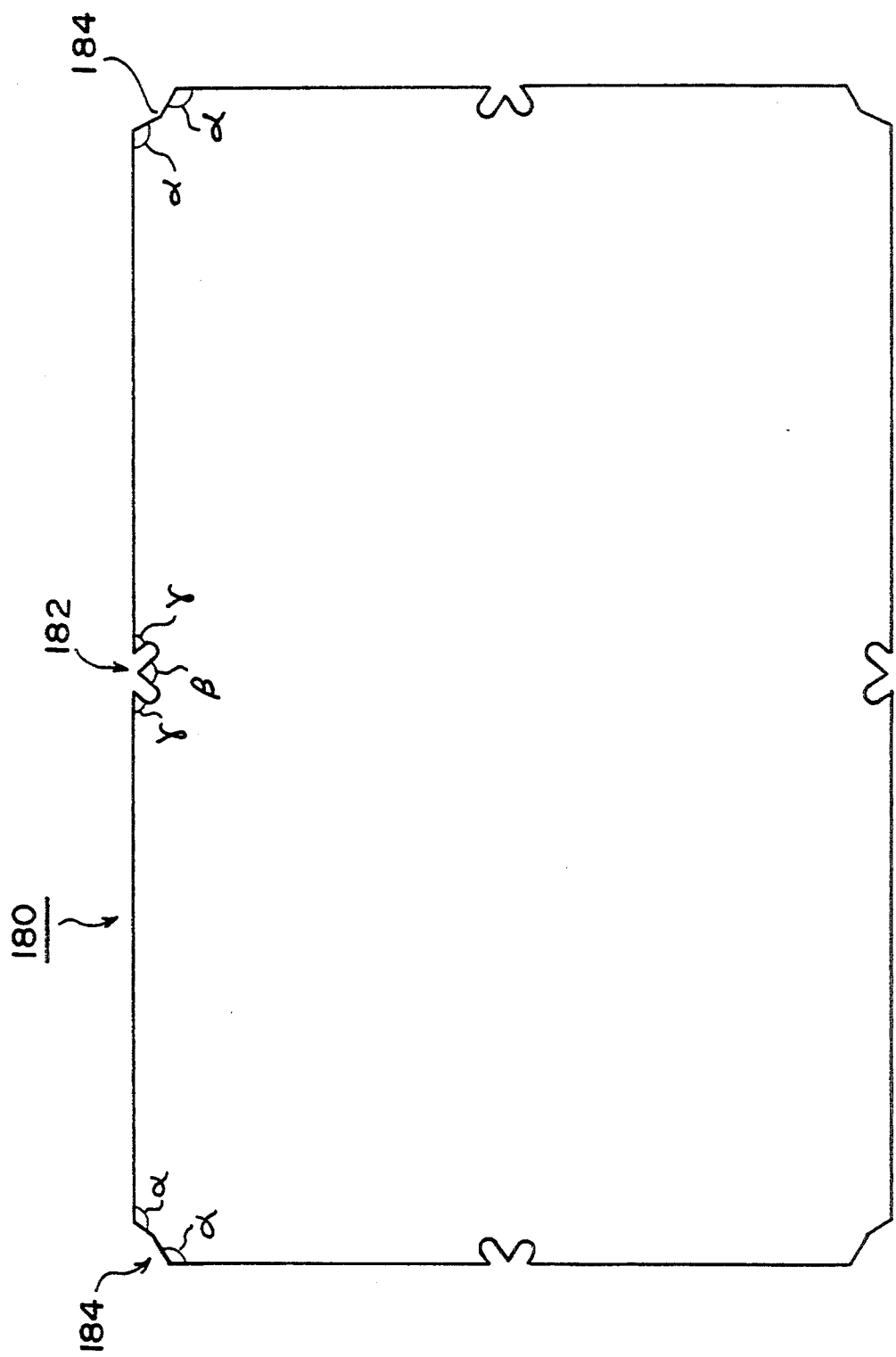

SPECIFICALLY CONFIGURED SHEET MEMBERS OR ARTICLES FOR USE IN IMPROVING SOUND OR IMAGE QUALITY

BACKGROUND OF INVENTION

This invention relates to novel means for improving the quality of sound or image to be reproduced and, more particularly, to specifically configured sheet members which are adapted to be adhesively attached to stringed musical instruments, loudspeakers, compact discs, laser discs or the like to improve their acoustic or imaging performance. Further, the invention relates to the formation in compact discs, laser discs, magnetic tapes, semiconductor chips, circuit boards, magnetic or IC cards or the like of a plurality of cut-outs so configured to reduce the interference caused by electromagnetic radiations therefrom.

FIELD OF THE INVENTION

Sources of electromagnetic radiations are ubiquitous in these days, including, for example, electric transmission lines, domestic interior wirings, household electric appliances, computers or other information processing apparatus, etc. It is relatively recently that the electromagnetic radiations have been found attributable to certain human health problems, and public awareness of the potential dangers has prompted manufacturers of various electric or electronic apparatus to take certain preventive measures against such hazzards. Recent-studies have also revealed that the electromagnetic radiations have the potential danger of causing malfunctioning of electronic apparatus located near its source. By way of example, many commercial airlines have forbidden use of certain electronic devices, such as portable telephones, personal computers or the like, within their airplanes during takeoffs or landings. This is because the electromagnetic radiations are considered to interfere with on-board flight instruments or flight control systems.

In the past, it has been common practice to use electromagnetic shielding to reduce or eliminate such interference. The electromagnetic shielding generally involves placing a metallic shielding plate around a radiation source to prevent escaping radiation therefrom instead of stopping or suppressing its generation. While the conventional approach is generally satisfactory, there is an ongoing need for straightforward and easy-to-implement methods or apparatus that can suppress the electromagnetic radiations emitted from electric or electronic apparatus.

Previously, the Inventor was engaged in the fabrication of stringed musical instruments such as guitars and violins and shared the knowledge that the tone of the instruments can be varied controllably by shaving their structural bodies or forming holes or cut-outs therein. Based on this knowledge, he conceived the idea of attaching sheet members of certain configurations to the bodies of such stringed instruments to attain equivalent results. As a result of extensive and painstaking studies, he discovered that the quality of sound can be improved through the attachment of such sheet members at predetermined locations on the bodies of guitars and violins and also that such sheet members may be formed of metals, papers, synthetic resins, cloths and the like.

The Inventor made further experiments on electric guitars and found similar improvements in the quality of sound. He then proceeded to attach the sheet members to loudspeakers, compact discs and their player, and laser discs (LDs) and their player and, to his great surprise, he recognized significant improvements in the quality of sound or image reproduced.

The Inventor also discovered that the quality of sound or image can likewise be improved by forming compact discs or laser discs in the same specific configuration as the sheet members.

The Inventor does not understand scientifically why and how such beneficial results are attained. However, he assumes that one underlying theory of his invention may be constructed on static electricity, and based on such assumption, he made the following experiments:

A television receiver set (Sanyo Electric: C-14B15) was used. It was turned on and the amount of electrostatic charges generated on the picture tube was measured using a static voltmeter (Nakamura:"Statiron M", B-2158). A probe of the static voltmeter was kept at 30 cm from the picture tube during the measurement. Then, about 50 of 6 mm (in diameter), specifically configured sheet members were attached to various subassemblies and components such as circuit boards, IC chips, the picture tube, etc. in the receiver set, and measurements of electrostatic charges generated were taken. The results of the measurements are as follows:

| Electrostatic charges: | |
| --- | --- |
| Without sheet members | 9 KV |
| With sheet members | 1 Kv |

With the sheet members attached, the amount of electrostatic charges generated was reduced to 1/9, and significant improvements in the quality of sound and image of the TV set were recognized by those who conducted the experiments.

SUMMARY OF THE INVENTION

This invention provides: specifically configured sheet members adapted for attachment to stringed musical instruments, loudspeakers, compact discs, laser discs or the like to improve their acoustic or imaging performance.

In accordance with a preferred embodiment the invention, a sheet member is generally circular or polygonal in shape and includes: a plurality of generally W-shaped cut-outs formed in the outer circumference of the sheet member; and a like plurality of generally V-shaped cut-outs formed in the outer circumference of the sheet member; the generally W-shaped cut-outs and the generally V-shaped cut-outs being arranged alternately and equi-angularly in the outer circumference of the sheet member. Each of the generally W-shaped cut-outs includes two indentations, each of which is defined by two sides merging with a bottom surface. The two indentations have their inner sides intersecting each other at a first predetermined acute angle, the two indentations having their outer sides intersecting the outer circumference of the sheet member at a second predetermined acute angle. Each of the generally V-shaped cut-outs is defined by two sides merging with a bottom surface, each of the two sides of the generally V-shaped cut-outs intersecting the outer circumference of the sheet member at a third predetermined obtuse angle. The first and second predetermined acute angles are between 55 and 65 degrees, and the third predetermined obtuse angle is between 115 and 125 degrees.

The sheet member of the invention is also effective to reduce the emission of electromagnetic radiations from electric cables if a plurality of such sheet members are placed between an inner insulating layer and an outer sheath layer serially along the length of the cable at a predetermined spacing.

This invention further provides compact discs, laser discs, magnetic tapes, semiconductor chips, circuit boards, magnetic or IC cards or the like which are modified to have a plurality of cut-outs so configured to reduce the interference caused by electromagnetic radiations therefrom to thereby improve the acoustic or imaging performance of apparatus incorporating the same.

Other features and advantages of the invention will be apparent from the following more detailed description of the preferred embodiments, taken in conjunction with the accompanying drawings, which illustrate by way of example, the principles of the invention.

BRIEF DESCRIPTION OF THE DRAWINGS

FIG. 11 is a schematic perspective view of a typical electric cable including the sheet members attached to reduce the interference caused by electromagnetic radiations from the cable;

FIG. 14 is a view similar to FIG. 11 but showing a modification of the conductors of the electric cable;

FIG. 15 is a cross-sectional view of one of the cable conductors of FIG. 14 having a plurality of cut-outs formed in the outer circumference thereof;

FIG. 19 is a plan view of a semiconductor chip having a plurality of cut-outs and recesses formed to reduce the interference caused by electromagnetic radiations from the chip;

FIG. 20 is a side view of the semiconductor chip shown in FIG. 19;

FIG. 28 is a plan view of a typical information storage card having a plurality of cut-outs formed in the outer circumference thereof to reduce the interference caused by electromagnetic radiations from the card.

DETAILED DESCRIPTION OF THE PREFERRED EMBODIMENTS

Figure 1:
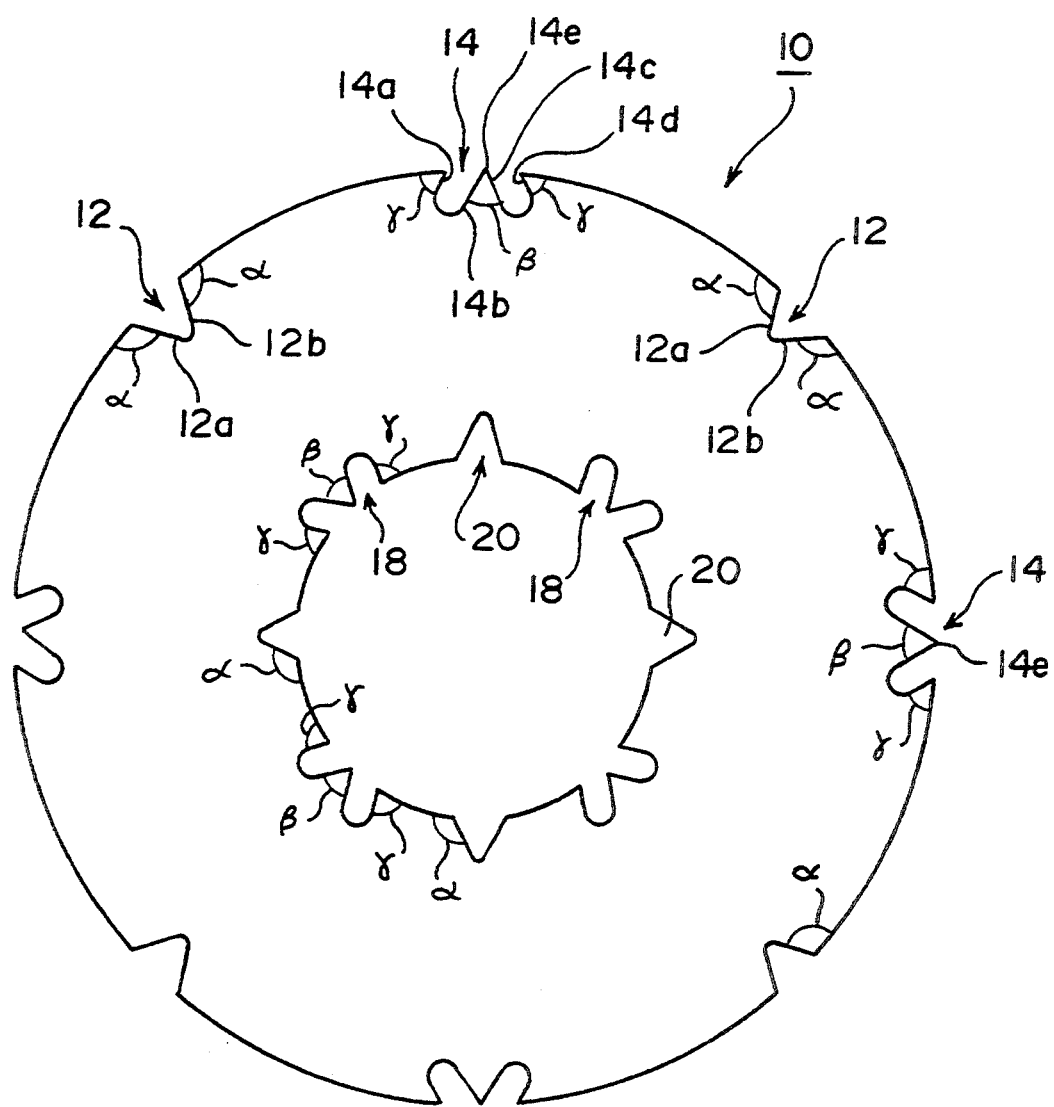
FIG. 1 is a plan view of a sheet member as constructed in accordance with a first embodiment of the invention.

Referring to FIG. 1, there is illustrated a sheet member generally designated at 10, which takes an annular shape. The sheet member 10 is formed of hard paper having a surface coating of a resinous material and an adhesive backing. The thickness and the diameter of the sheet member may be selected dependent upon its specific applications.

The sheet member 10 includes a plurality of generally V-shaped cut-outs 12 and a like plurality of generally W-shaped cut-outs 14 both formed in the outer circumference thereof. These cut-outs 12, 14 are arranged alternately and equi-angularly in the outer circumference of the sheet member 10.

Each of the generally V-shaped cut-outs 12 is defined by two generally straight sides 12a, 12b which merge with each other in a curved bottom. The generally straight sides of each generally V-shaped cut-out 12 intersect the outer circumference of the sheet member at a predetermined obtuse angle α. The predetermined obtuse angle may be between 115 and 125 degrees, and preferably 120 degrees.

Each of the generally W-shaped cut-outs 14 consists of two indentations extending away from each other. Each indentation is defined by two generally parallel sides 14a, 14b or 14c, 14d which merge with each other in a curved bottom. The inner sides 14b, 14c of the indentations intersect each other at a first predetermined acute angle β, forming a pointed portion 14e. The outer side 14a or 14d of each indentation intersect the outer circumference of the sheet member 10 at a second predetermined acute angle α. The first and second predetermined acute angles β,α may be between 55 and 65 degrees, and preferably 60 degrees.

The annular sheet member 10 also includes a plurality of generally W-shaped cut-outs 18 and a like plurality of generally V-shaped cut-outs 20 formed in the inner circumference thereof. Like the cut-outs 12, 14 in the outer circumference, these cut-outs 18, 20 are arranged alternately and equi-angularly along the inner perimeter of a central opening 22. The cut-outs 18, 20 are of substantially the same configurations as, but somewhat smaller than, the cut-outs 14, 12. It should be noted that each generally V-shaped cut-out 12 in the outer circumference of the sheet member is disposed in radial alignment with each generally W-shaped cut-out 18 in the inner circumference, while each generally W-shaped cut-out 14 in the outer circumference is disposed in radial alignment with each generally V-shaped cut-out 20 in the inner circumference of the sheet member.

Although the sheet member 10 is shown as having four generally W-shaped cut-outs and four generally V-shaped cut-outs in each of the inner and outer circumferences thereof, it is to be understood that this invention is not so limited and that any appropriate number of the cut-outs can be formed in the sheet member.

Each sheet member 10 has an adhesive backing, and it is preferable that a plurality of such sheet members are peelably mounted on a board for easy removal and attachment.

Figure 2:
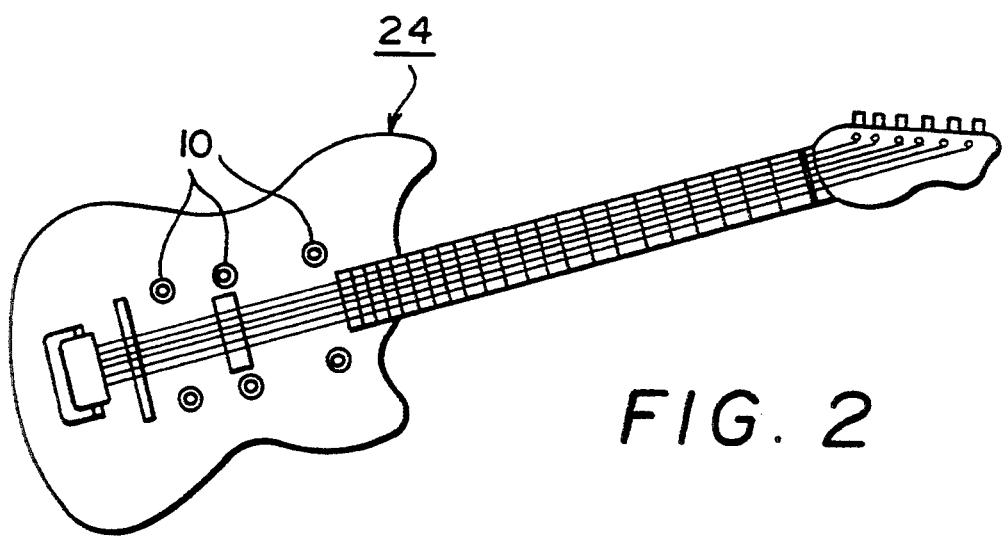
FIG. 2 is a schematic view of a typical electric guitar having attached thereto a plurality of the sheet members of the invention for improving the acoustic performance of the guitar.

FIG. 2 is a schematic plan view of a typical electric guitar 24 showing how and where six of the sheet members 10 are adhesively attached to the body of the guitar. In this embodiment, each sheet-member 10 is 45 mm in diameter and the diameter of the opening is 20 mm. The thickness of the sheet member is 100 and 1 mm. The location for attachment of the sheet members 10 can be determined empirically. Specifically, the location can be adjusted or on a trial and error basis to optimize the acoustic performance of the guitar. Experiment has verified that judicious selection of the attachment locations results in significant improvements in the acoustic performance.

Figure 3:
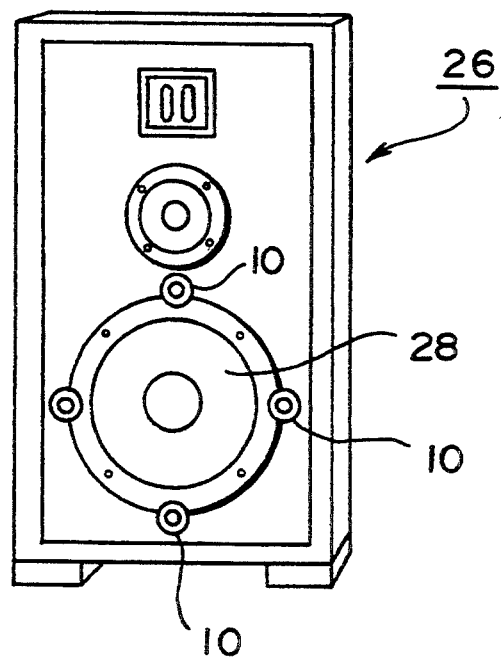
FIG. 3 is a schematic perspective view of a conventional loudspeaker having a plurality of the sheet members of the invention attached around the woofer.

FIG. 3 is a schematic front view of a conventional loudspeaker 26 showing four such sheet members 10 attached around the woofer 28 equi-angularly to improve the quality of sound to be reproduced thereby. Although not shown, it is possible to further improve the quality of reproduced sound by attaching four additional sheet members 10 in a manner to surround each input terminal of the loudspeaker. Likewise, the attachment location and the number of the sheet members 10 may be adjusted on a trial and error basis until a desired optimization of the acoustic performance is attained.

The Inventor has thus far been unsuccessful in constructing the specific theory underlying his invention. However, he assumes that there are two conceivable bases for the improved acoustic performance: First, the sheet members may be considered to act to suppress the electromagnetic radiations omitted from a guitar or a loudspeaker, which would otherwise affect their acoustic performance. Second, the weight of the sheet members coupled with the air resistance caused by the sheet thickness during vibrations serves to change the resonance frequency so as to improve the acoustic performance. In prior practice, the resonant portions of a guitar or a loudspeaker were shaved to cause a slight weight reduction to change the resonance frequency. In this invention, the attachment of the sheet members has the effect of causing a slight increase in the weight of the resonant portions resulting in a slight change in the resonance frequency.

Figure 4:
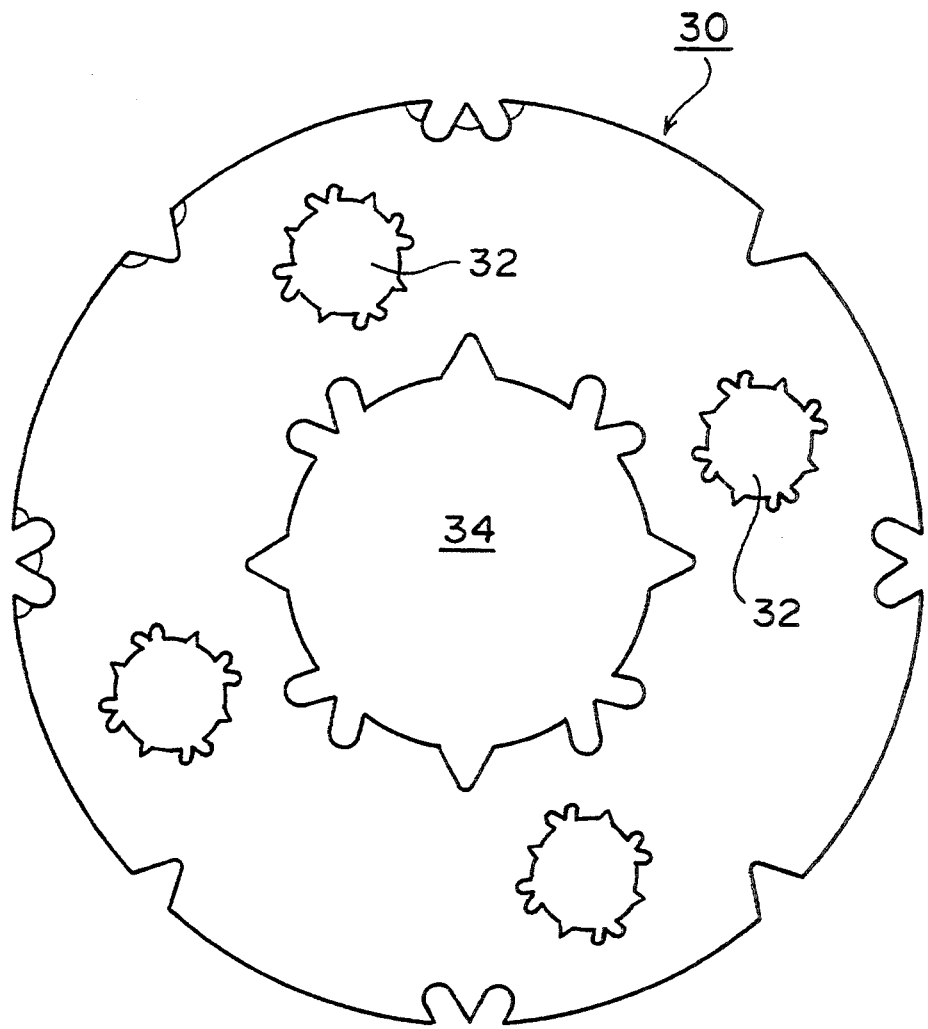
FIG. 4 is a view similar to FIG. 1 but showing a second embodiment of the sheet member of the invention.

FIG. 4 shows a second-embodiment of the present sheet member 30 which differs from that of FIG. 1 in the formation of four additional openings 32. These additional openings 32 are of identical configuration to, but smaller than, a central opening 34. They are disposed equi-angularly in the annular portion of the sheet member 30.

Figure 5:
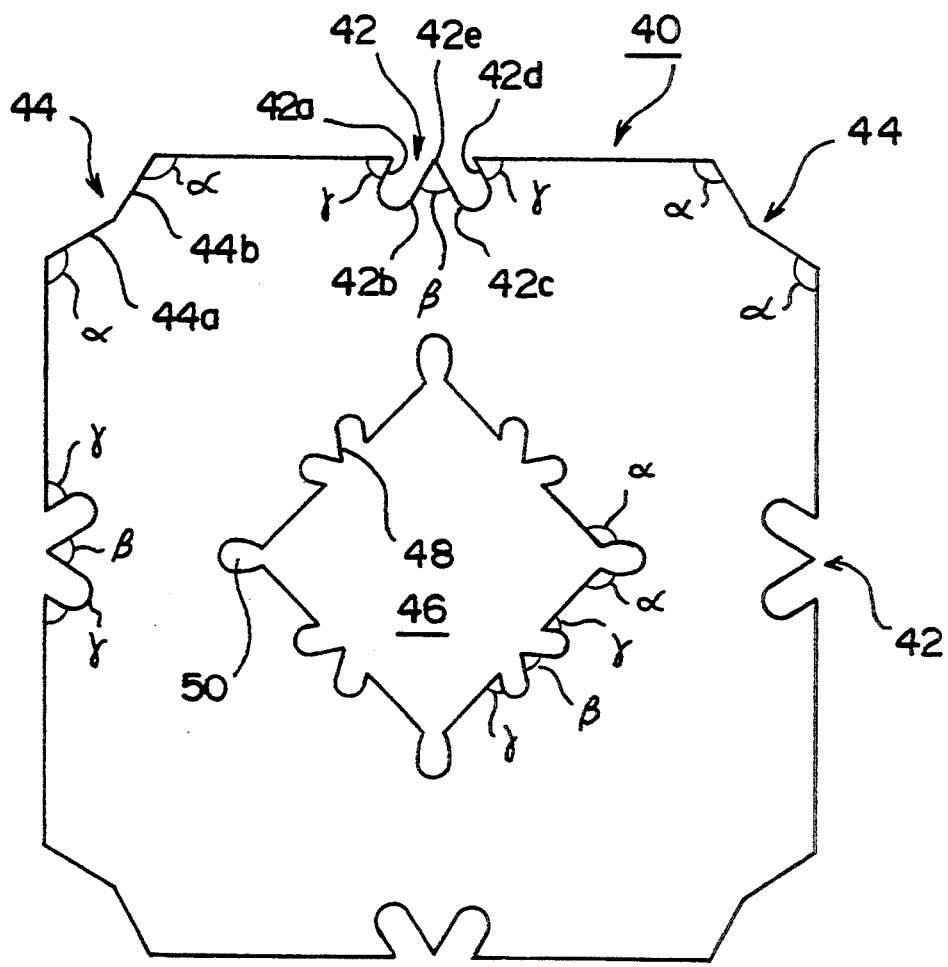
FIG. 5 is a view similar to FIG. 1 but showing a third embodiment of the sheet member of the invention.

FIG. 5 shows a third embodiment of the present sheet member 40 which is generally square in shape. As shown, the sheet member 40 includes a generally W-shaped cut-out 42 disposed centrally in each side thereof, and a generally V-shaped cut-out 44 disposed in each corner thereof. Each generally V-shaped cut-out 44 is defined by two generally straight sides 44a, 44b intersecting each other. Each side 44a or 44b also intersects its adjacent side of the sheet member 40 at a first predetermined obtuse angle $\alpha$. The first predetermined obtuse angle may be between 115 and 125 degrees.

Each generally W-shaped cut-out 42 consists of two indentations extending away from each other, each indentation being defined by two generally straight sides 42a, 42b or 42c, 42d merging with each other in a curved bottom. The inner sides 42b, 42c of the indentations intersect each other at a first predetermined acute angle $\beta$, forming a pointed portion 42e. The outer side 42a or 42d of each indentation intersect the side of the sheet member 40 at a second predetermined acute angle $\alpha$. The first and second predetermined acute angles $\beta, \alpha$ may be between 55 and 65 degrees, and preferably 60 degrees.

The sheet member 40 includes a generally square central opening 46, a generally W-shaped cut-out 48 centrally formed in each side of the central opening 46, and a generally V-shaped cut-out 50 formed in each corner of the central opening.

Figure 6:
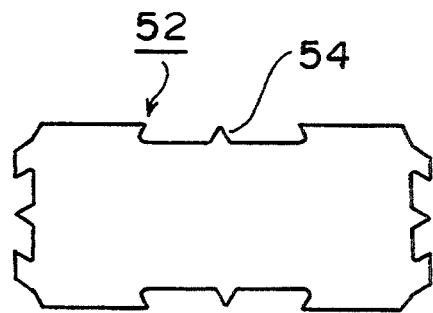
FIG. 6 is a view similar to FIG. 1 but showing a fourth embodiment of the sheet member of the invention.

FIG. 6 shows a fourth embodiment of the present sheet member 52 which is generally rectangular in shape. As shown, the sheet member 52 differs from that of FIG. 5 in the absence of the central opening 46. Although each of generally W-shaped cut-outs 54 is relatively wide, this rectangular sheet member 52 provides the beneficial result as described above in connection with the above embodiments.

It should be noted that the sheet member of the present invention can take any of other polygonal shapes so long as it includes a plurality of generally W-shaped cut-outs and a like plurality of generally V-shaped cut-outs formed in such a manner as to reduce the interference caused by electromagnetic radiations from an article or device to which the sheet member is adhesively attached. It should also be noted that the sheet member of the invention can be formed of paper, gold, silver, copper, titanium or other metals, synthetic resins, cloths, and mixtures or composites of these materials.

Figure 7:
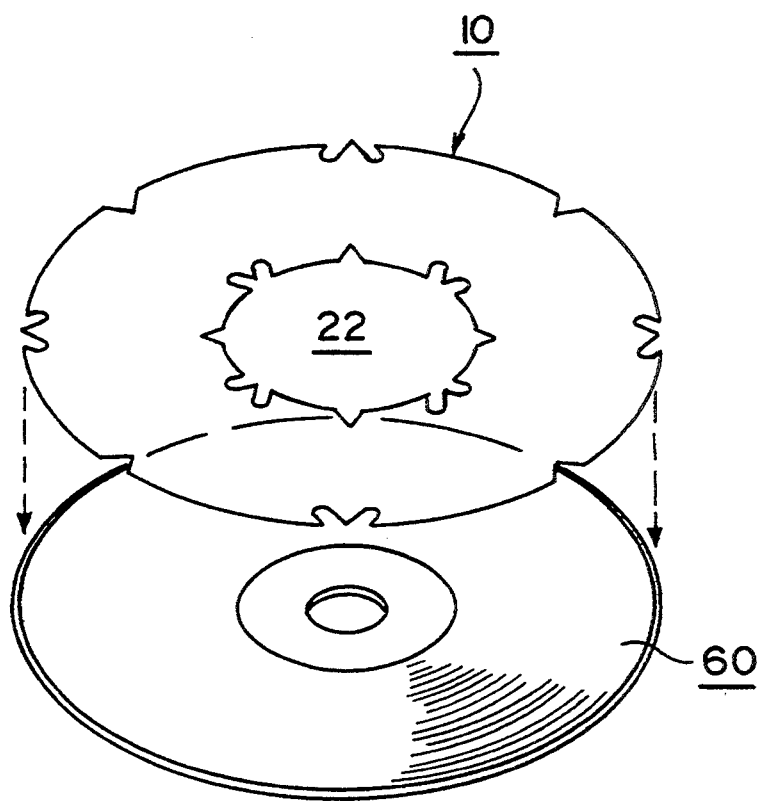
FIG. 7 is a schematic perspective view showing the sheet member of the invention as applied to a digital compact disc to improve the quality of sound to be reproduced.

Referring to FIG. 7, there is shown the annular sheet member 10 of the invention as applied to a digital compact disc (CD) 60 to improve the quality of sound to be reproduced. The sheet member 10 is formed of a transparent vinyl chloride resin material and has an adhesive backing. The sheet member 10 is of generally the same diameter as the compact disc, or 115 mm, End the diameter of the central opening 22 is 46 mm. The attachment of the transparent sheet member to the front surface of the compact disc permits a label thereon to be viewed through the sheet.

Figure 8:
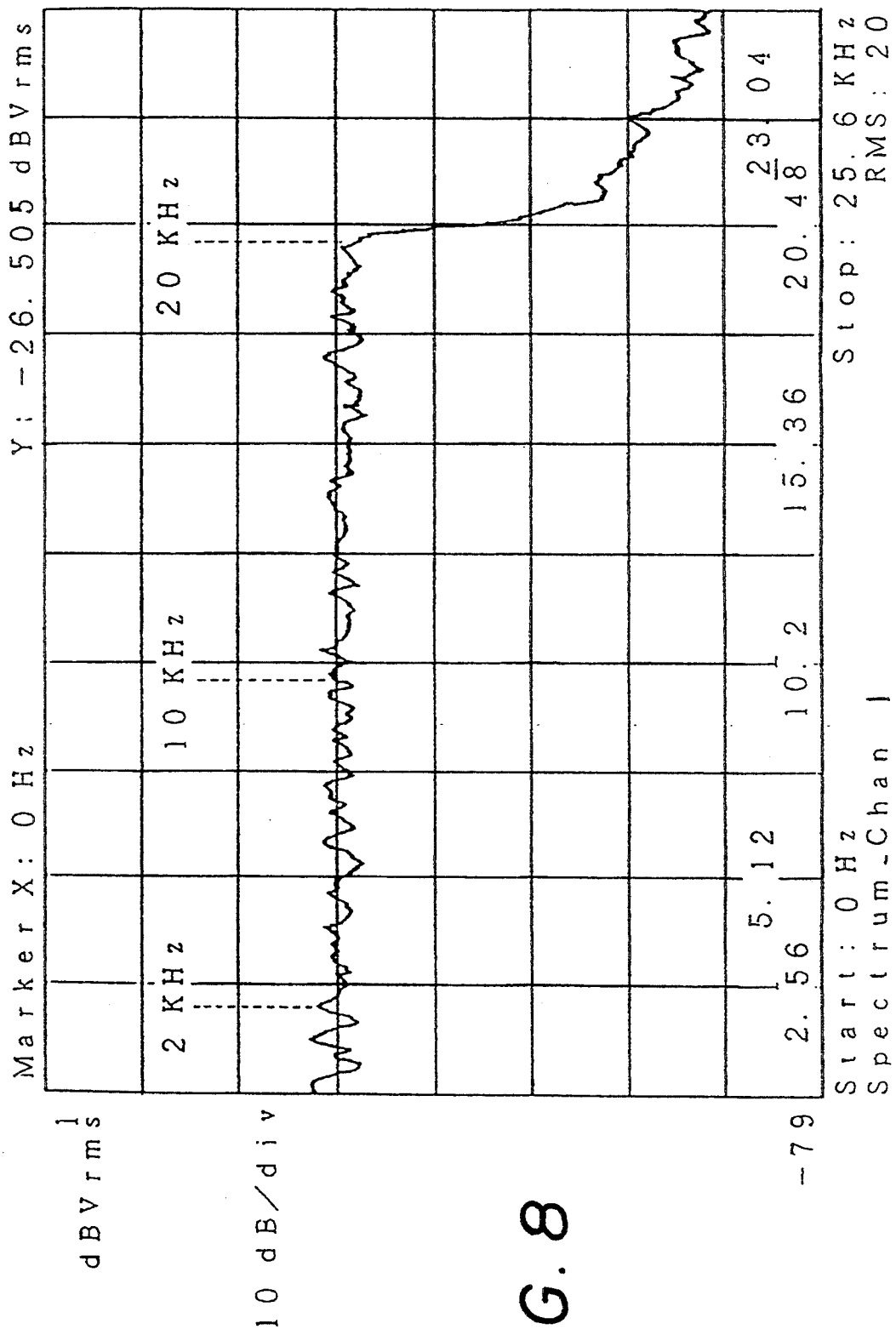
FIGS. 8 and 9 are graphs showing the frequency characteristics of the compact disc with or without the sheet member attached thereto, respectively.
Figure 9:
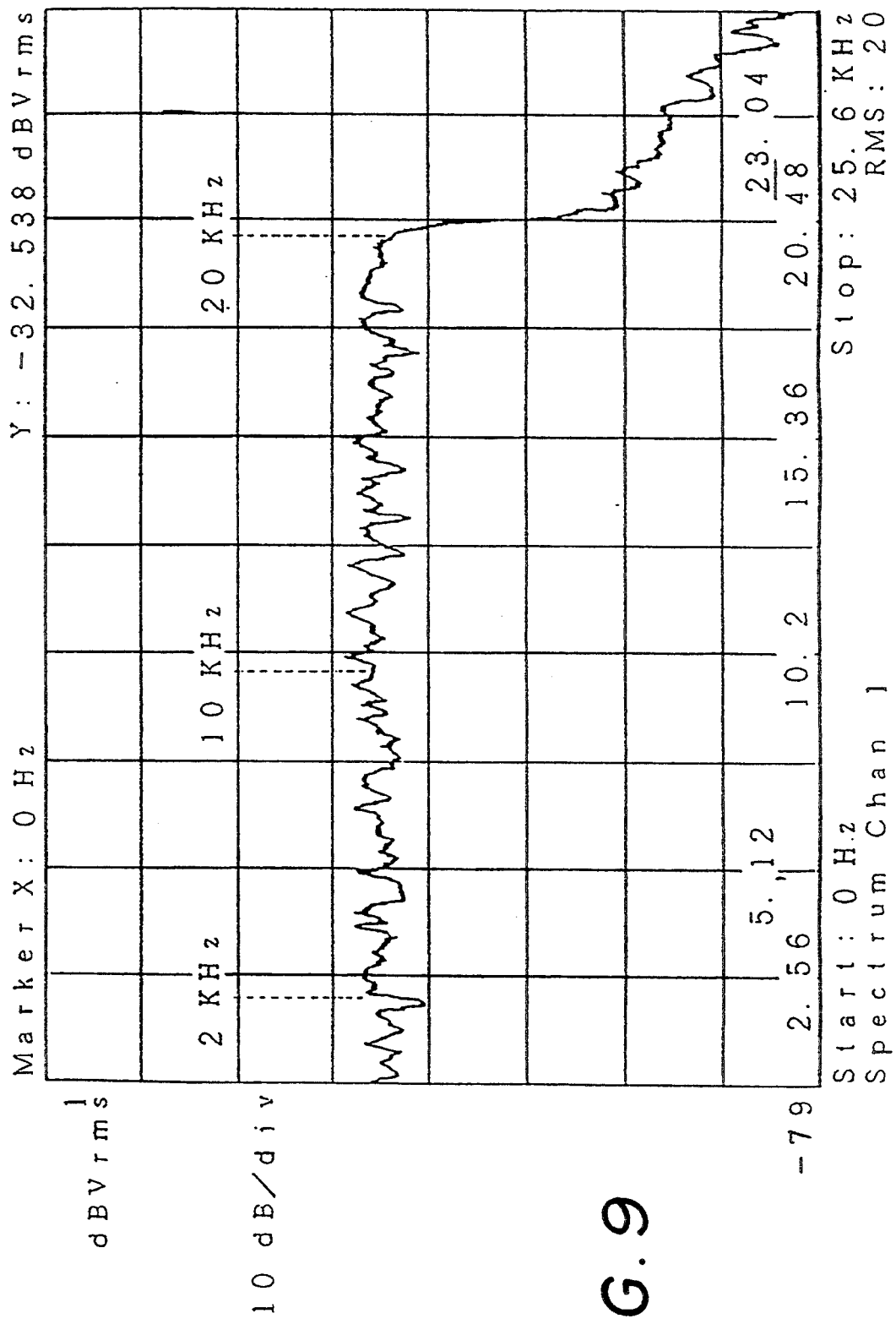

FIGS. 8 and 9 are graphs showing the frequency characteristics of the conventional compact disc with or without the attachment of the sheet members thereto, respectively. It is apparent from these graphs that the resulting frequency characteristic curve for the compact disc with the sheet member attached is stable or flat as compared to the compact disc without such sheet member. Accordingly, the attachment of the sheet member to compact discs has the beneficial effect of improving the quality of sound to be reproduced.

The compact disc is formed of a plastic material. It is considered that, during playback, its high speed rotation causes static electricity due to the friction with the surrounding air and that alternating cycles of charging and discharging occur. This seems to cause electromagnetic radiations to be emitted from the compact disc. A compact disc player is comprised of many semiconductor chips, an electric motor and some other components, which are considered to be sources of electromagnetic radiations. The Inventor assumes that the electromagnetic radiations from the compact disc player somehow interfere with the electromagnetic radiations generated from the static electricity on the compact disc, in a manner to adversely affect the quality of reproduced sound. Experiment has verified that the amount of electrostatic charges generated from the compact disc with the sheet member attached is significantly reduced, resulting in a reduced interference of electromagnetic radiations thereby improving the quality of reproduced sound.

Figure 10:
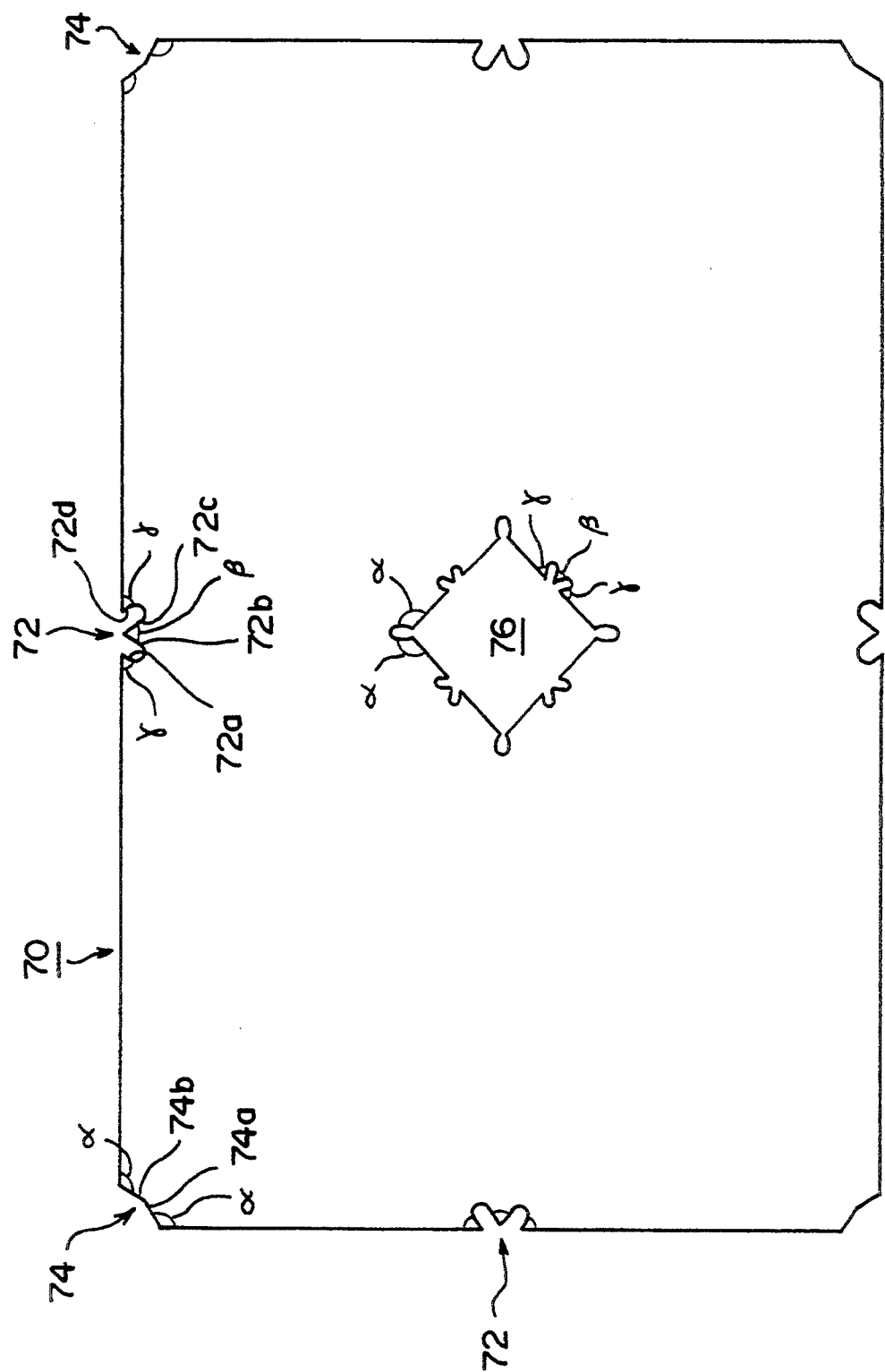
FIG. 10 is a plan view of a circuit board having a plurality of cut-offs so configured to reduce the interference caused by electromagnetic radiations from components mounted on the board.

FIG. 10 is a plan view showing a circuit board 70 as constructed in accordance with a preferred embodiment of the invention. As shown, the circuit board 70 is of generally rectangular in shape, including a generally W-shaped cut-out 72 formed in each side thereof, and a generally V-shaped cut-out 74 formed in each corner thereof. Each generally V-shaped cut-out 74 is defined by two generally straight sides 74a, 74b intersecting each other. As in the previously described embodiments, Each side 74a or 74b also intersects its adjacent side of the circuit board at a first predetermined obtuse angle $\alpha$. The first predetermined obtuse angle may be between 115 and 125 degrees.

Each generally W-shaped cut-out 72 consists of two indentations extending away from each other, each indentation being defined by two generally straight sides 72a, 72b or 72c, 72d merging with each other in a curved bottom. The inner sides 72b, 72c of the indentations intersect each other at a first predetermined acute angle $\beta$, forming a pointed portion 72e. The outer side 72a or 72d of each indentation intersect the side of the circuit board at a second predetermined acute angle $\alpha$. The first and second predetermined acute angles $\beta, \alpha$ may be between 55 and 65 degrees, and preferably 60 degrees. The circuit board also includes a generally square central opening 76 which is of generally same configuration as that of the FIG. 5 embodiment.

It should be noted that the use of the circuit board 70 to mount thereon various components considered as electromagnetic radiation sources results in a significant reduction in the interference caused by electromagnetic radiations from the components thus improving the quality of sound or image produced by apparatus incorporating such components.

FIG. 11 is a fragmentary, perspective view of an electric cable 80 incorporating a sheet member 82 embodying the invention. As shown, the cable 80 includes two conductors 84 of generally circular cross section, each conductor having an inner sheath 86 surrounding it. The inner sheath 86 has silk yarn 88 wound thereon which in turn is covered with a winding 90 of shield paper. The shield paper 90 is covered with an outer sheath 92. The sheet member 82 may be of substantially the same configuration as that shown in FIGS. 1 or 4 to 6. Each sheet member 82 may preferably be 5 mm in diameter. In order to optimally reduce the interference caused by electromagnetic radiations from the electric cable, it should be noted that the sheet members 82 should be serially arranged along the length of the cable at a predetermined spacing, e.g., 30 cm.

Experiment has verified that the disposition of the sheet members 82 in the manner as described above resulted in a significant reduction in the emission of electromagnetic radiations from the cable. The amount of electromagnetic radiations was measured in a 4 m wide, 7 m long, 3 m high measuring chamber (Tokin-Yasumuro Denpa Co.) using a spectrum analyzer (Anritsu Co.:MS2601A) and a biunical antenna system (Schkurtzbec Co.). The measuring chamber was enclosed by copper plates. During the measurement, the cable was in a state of energization and it was placed on a turntable which was vertically movable between 0.3 and 2.5 m in height. The spectrum analyzer was placed outside the measuring chamber, and the antenna was placed inside the chamber.

Figure 12:
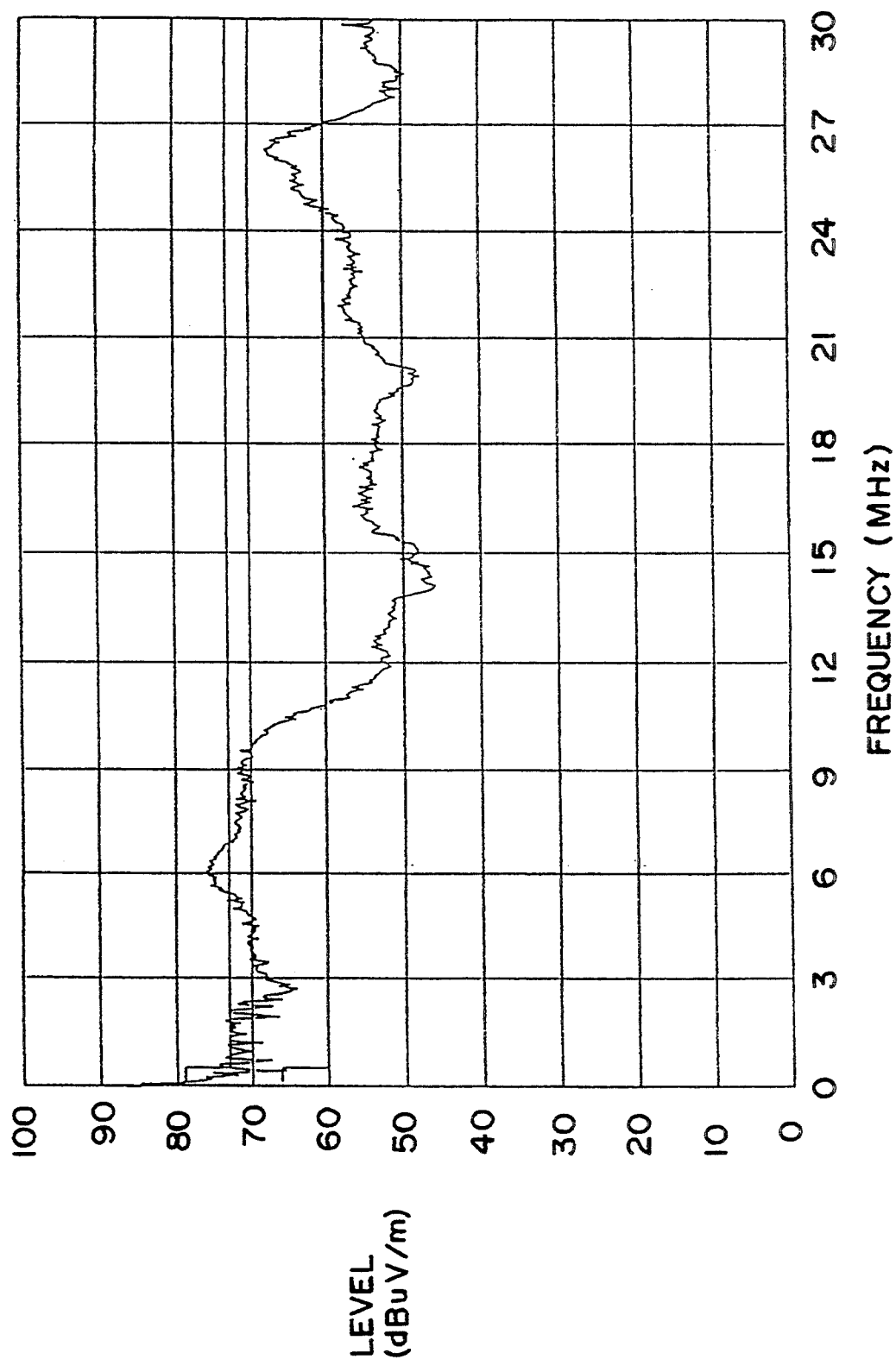
FIGS. 12 and 13 are graphs showing the level of electromagnetic radiations emitted from the electric cable with or without the sheet members attached thereto, respectively.
Figure 13:
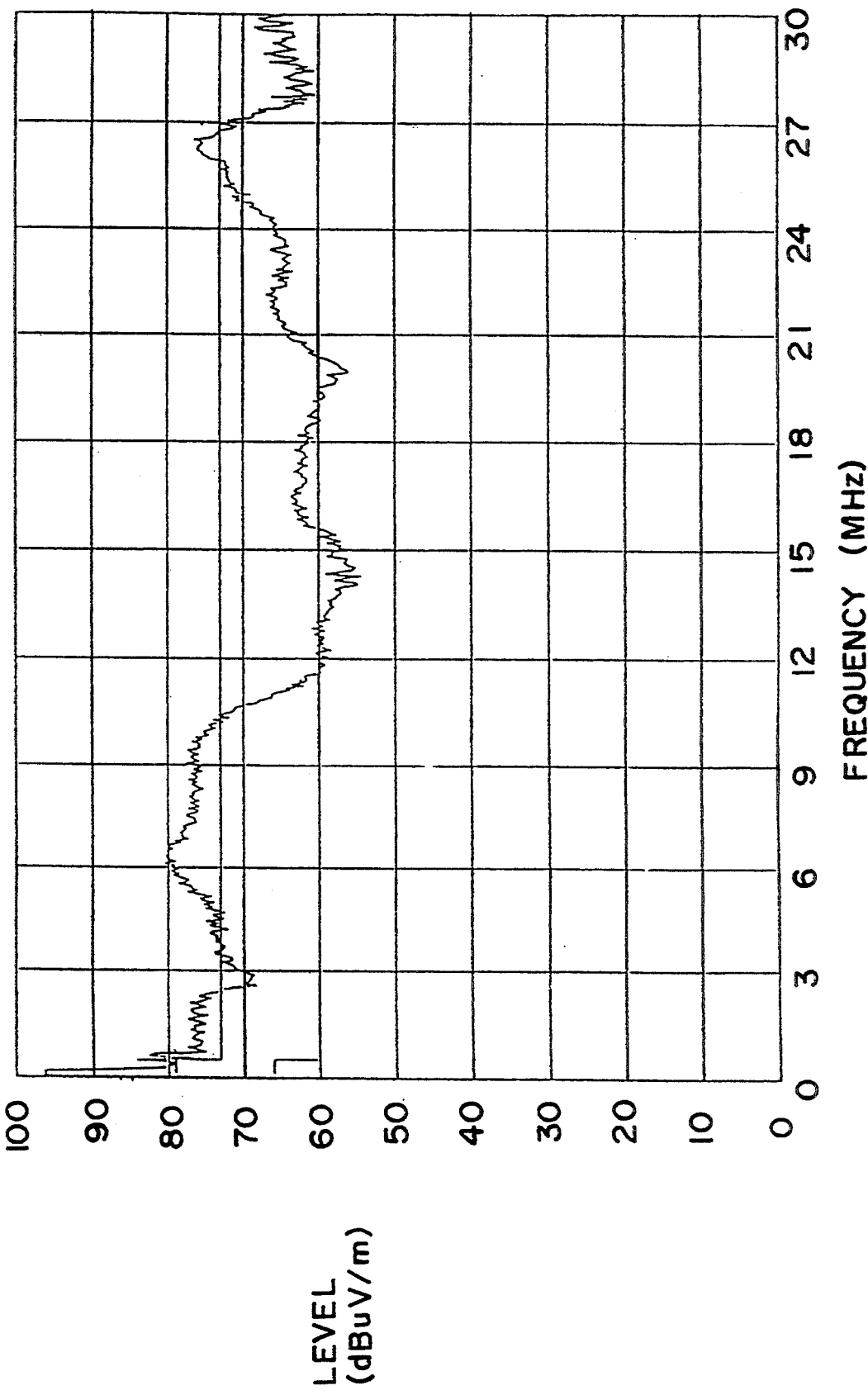

FIGS. 12 and 13 are graphs showing the emission of electromagnetic radiations for the electric cable with the sheet members attached thereto and a similar electric cable without such sheet members, respectively. From these graphs, it is apparent that the sheet members have the significant effect of reducing the amount of electromagnetic radiations emitted from the electric cable.

FIG. 14 is a view similar to FIG. 11 but showing a modification of the electric cable 90 whose conductors 92 have a specific cross section as shown in the cross-sectional view of FIG. 15. As shown therein, each cable conductor 92 includes four generally W-shaped cut-outs 94 and four generally V-shaped cut-outs 96, both formed equi-angularly along the length of the conductor. Experiment has confirmed that the use of these conductors serves to further reduce the emission of electromagnetic radiations from the cable.

Figure 16:
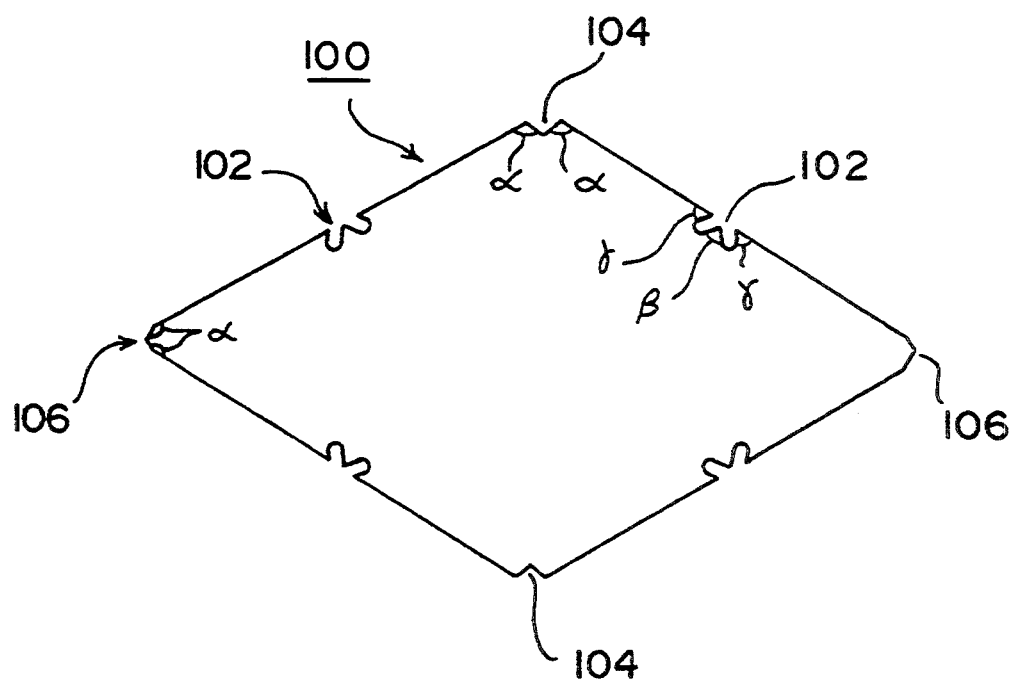
FIG. 16 is a view similar to FIG. 15 but showing a modification of the cable conductor.
Figure 17:
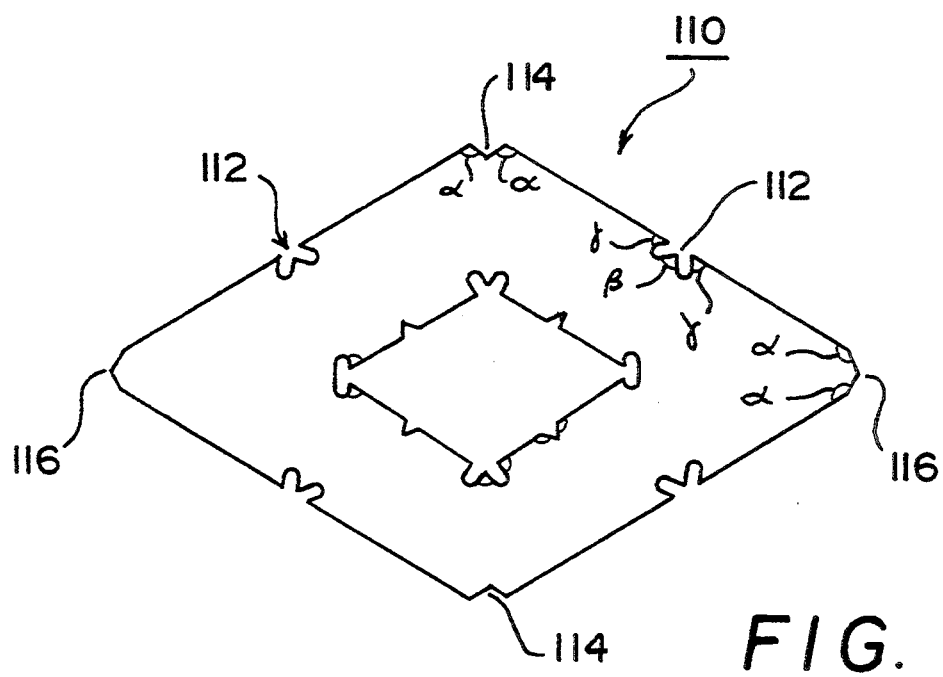
FIG. 17 is a view similar to FIG. 15 but showing another modification of the cable conductor.

FIGS. 16 and 17 are views similar to FIG. 15 but showing further modifications of the cable conductors 100, 110, respectively. As shown, they have generally rhombic cross sections and include generally W-shaped cut-out 102, 112 formed in each side thereof and generally V-shaped cut-outs 104, 114 formed in two of the corners thereof. The remaining two corners of the rhombic cross section are somewhat pointed at 106, 116. In the embodiment of FIG. 17, the cable conductor 110 is generally tubular, including a central opening 118 extending along the length of the conductor. The central opening 118 also includes a generally V-shaped cut-out 120 formed in each side in radial alignment with each generally W-shaped cut-out 112 formed in one outer side, and a generally W-shaped cut-out 122 formed in each of the two corners in radial alignment with each of the generally V-shaped cut-outs 114. The remaining two corners in radial alignment with the pointed portions 116 are formed with wide indentations 124.

Figure 18:
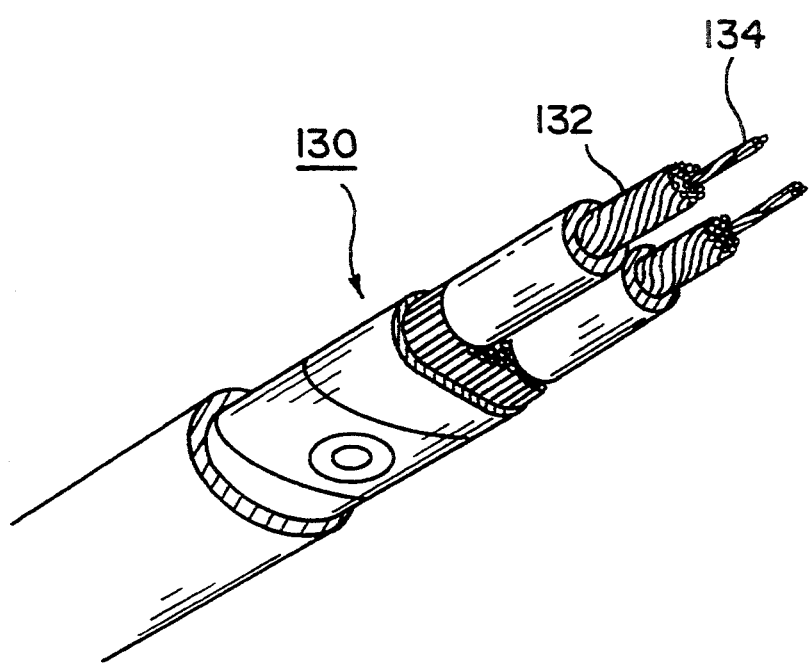
FIG. 18 is a view similar to FIG. 11 but showing a further modification of the cable conductors.

FIG. 18 is a view similar to FIG. 11 but showing a still further modification of the electric cable. As shown, each cable conductor 130 is comprised of a twisted copper wire 132 and a twisted brass wire 134 having a smaller diameter than, and covered by the copper wire. A wire made of aluminum or other metals can be replaced for the copper wire. Also, silk yarns can be substituted for the brass wire.

Figure 21:
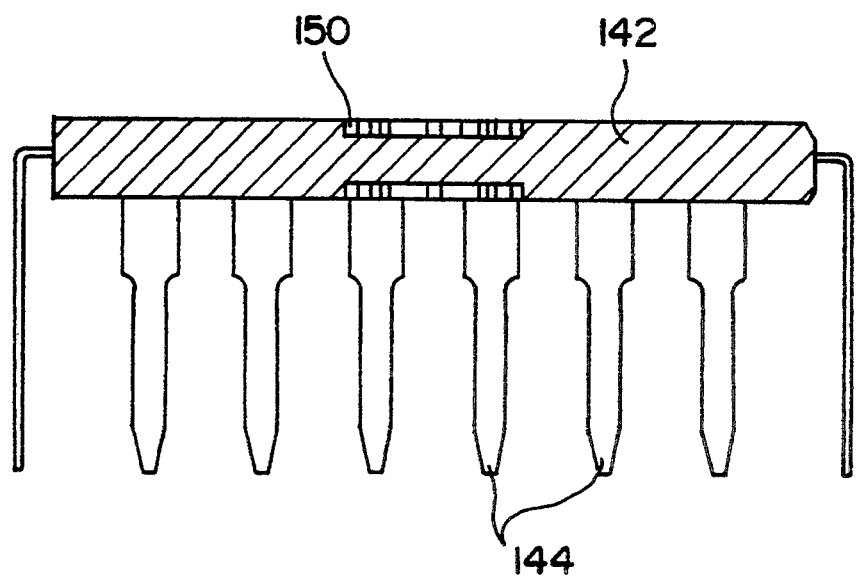
FIG. 21 is a cross-sectional view of the semiconductor chip as taken along lines A—A of FIG. 19.

FIGS. 19 and 20 are a plan and a side view, respectively, of a semiconductor chip 140 as constructed in accordance with a preferred embodiment of the invention. FIG. 21 is a cross-sectional view as taken along line A—A of FIG. 19. As shown, the semiconductor chip 140 is generally square in plan view, including a package 142 having six leads 144 extending from each side thereof. The package 142 includes one generally W-shaped cut-out 146 centrally formed in each side surface thereof, and one generally V-shaped cut-out 148 formed in each corner thereof. These cut-outs 146, 148 are of substantially the same configurations as in the embodiments described previously in connection with FIGS. 5, 6 and 10.

The package 142 also includes five recesses 150 formed in the upper surface thereof. One such recess 150, which is disposed centrally in the package 142, is clearly shown in FIG. 21. Each of the remaining four recesses 150 is disposed between each corner and the central recess in alignment therewith. Each recess is 0.5 mm in depth and has four generally W-shaped cut-outs and four generally V-shaped cut-outs arranged alternately and equi-angularly like some of the previously described embodiments.

Figure 22:
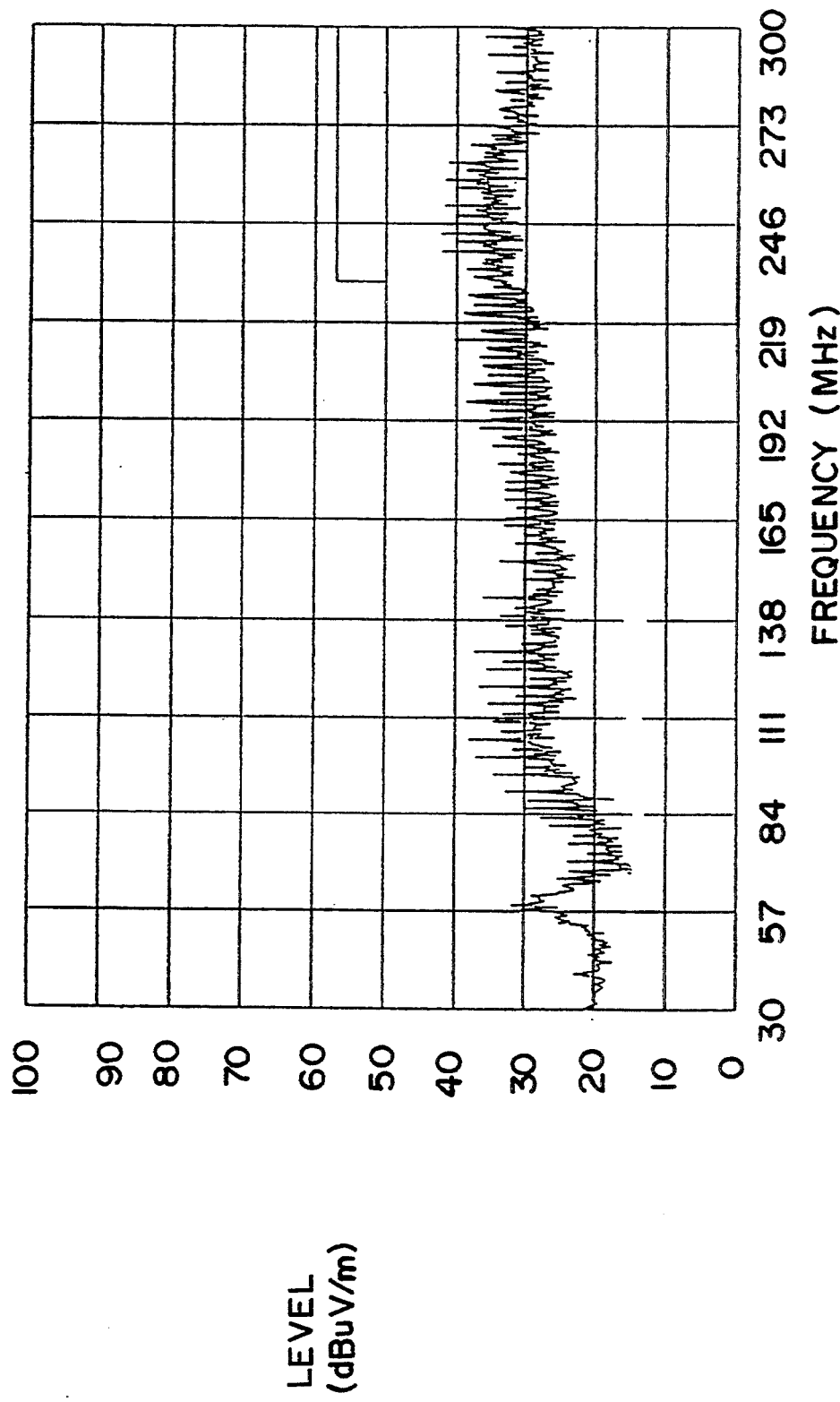
FIGS. 22 and 23 are graphs showing the measured level of electromagnetic radiations from the semiconductor chip with or without the cut-outs and recesses.
Figure 23:
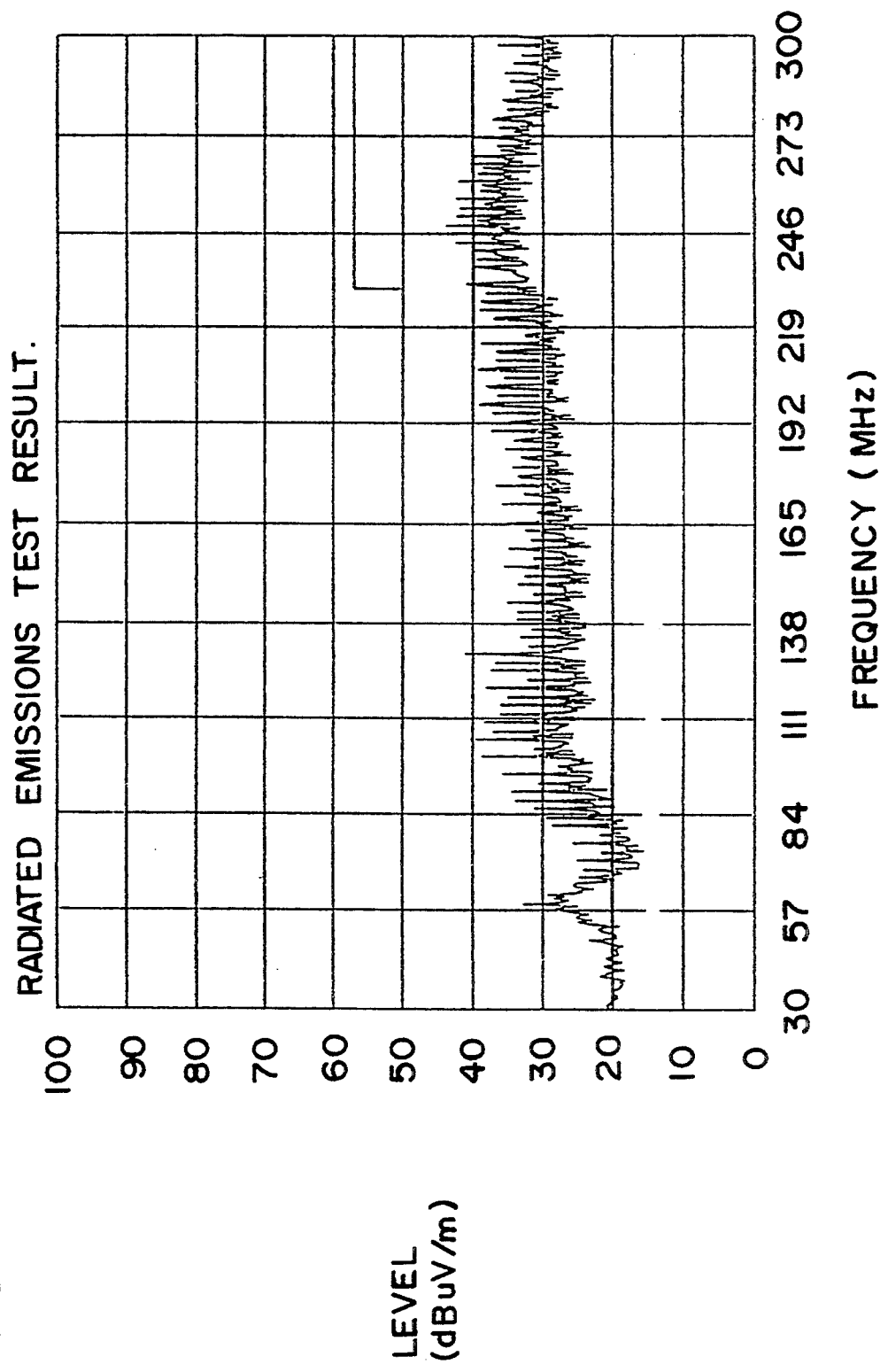

The Inventor made experiments on this semiconductor chip using the same set of instruments and measuring chamber as used for the electric cable of FIG. 11. As a result, it was observed that the emission of electromagnetic radiations from the semiconductor chip formed with the cut-outs and recesses was at lower levels than that without such cut-outs and recesses. FIGS. 22 and 23 which are graphs showing the measured levels of electromagnetic radiations from the semiconductor chip with or without the cut-outs and recesses, respectively, verify the presence of the benificial result of the invention.

Figure 24:
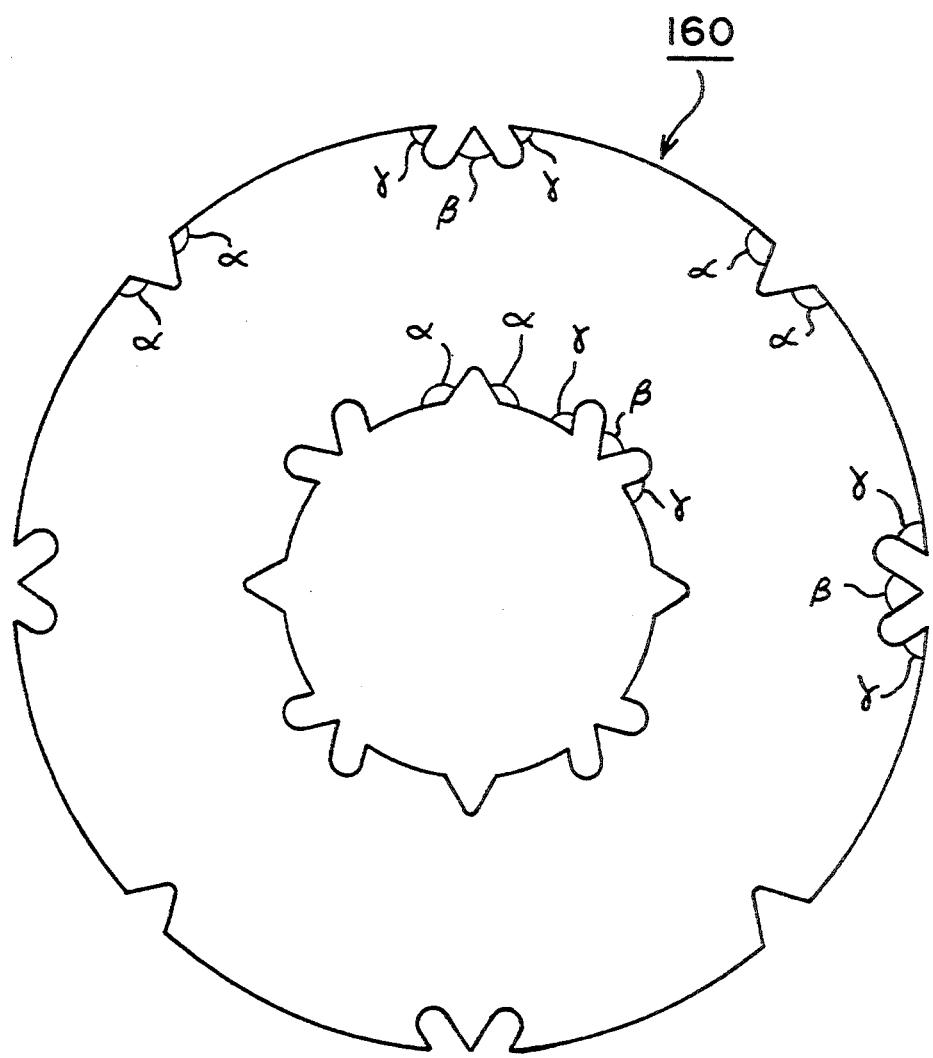
FIG. 24 is a plan view of a typical compact disc having a plurality of cut-outs formed in the inner and outer circumferences thereof.

FIG. 24 shows a compact disc 160 modified to have a plurality of cut-outs formed therein. The general configuration of the compact disc 160 is the same as the sheet member of FIG. 1. The compact disc is 120 mm in diameter, and its central opening is 15 mm in diameter. The radial depth of each cut-out is selected so as not to extend into any information storage area.

Figure 25:
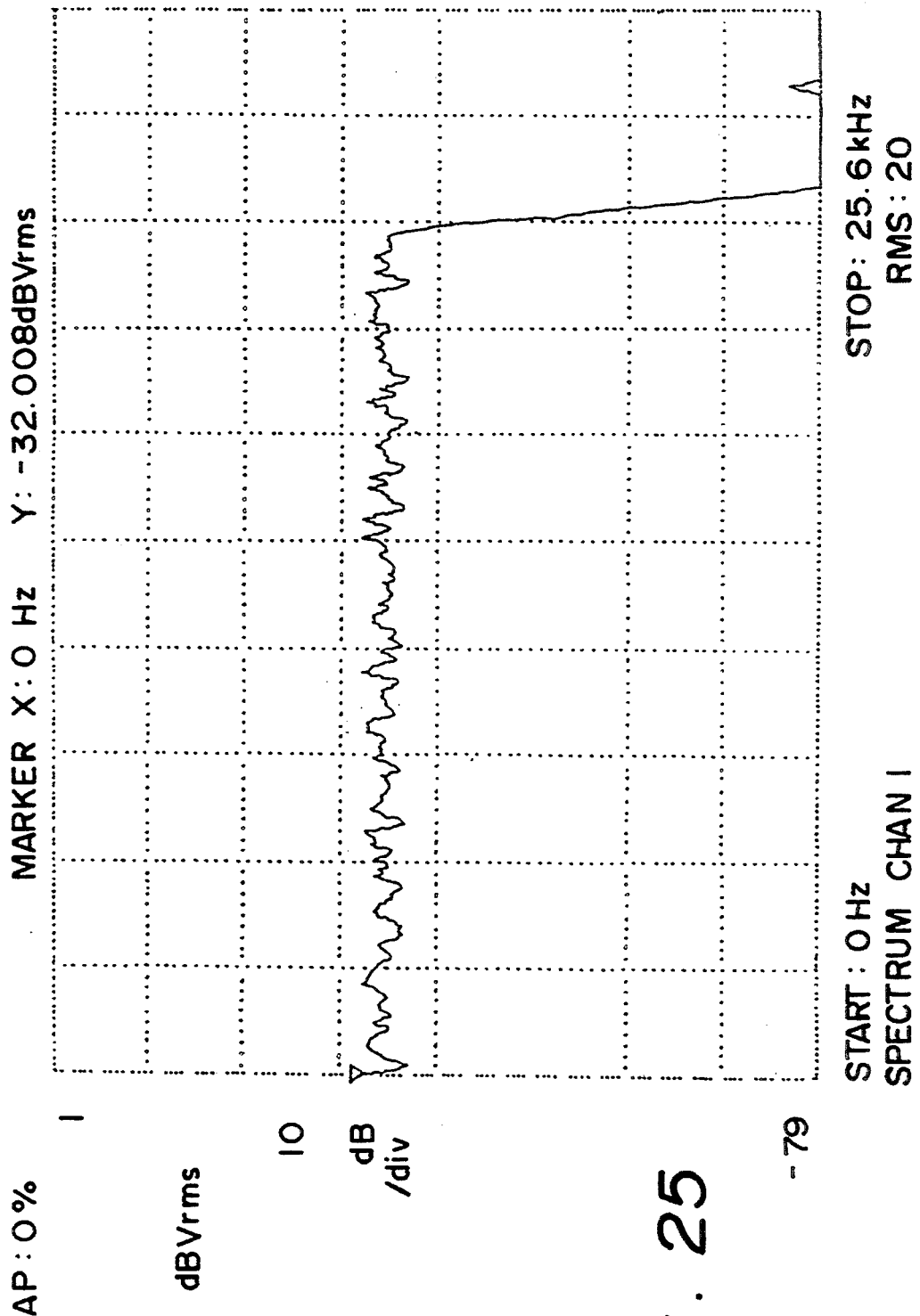
FIGS. 25 and 26 are graphs showing the frequency characteristics of the compact disc with or without the cut-outs, respectively.
Figure 26:
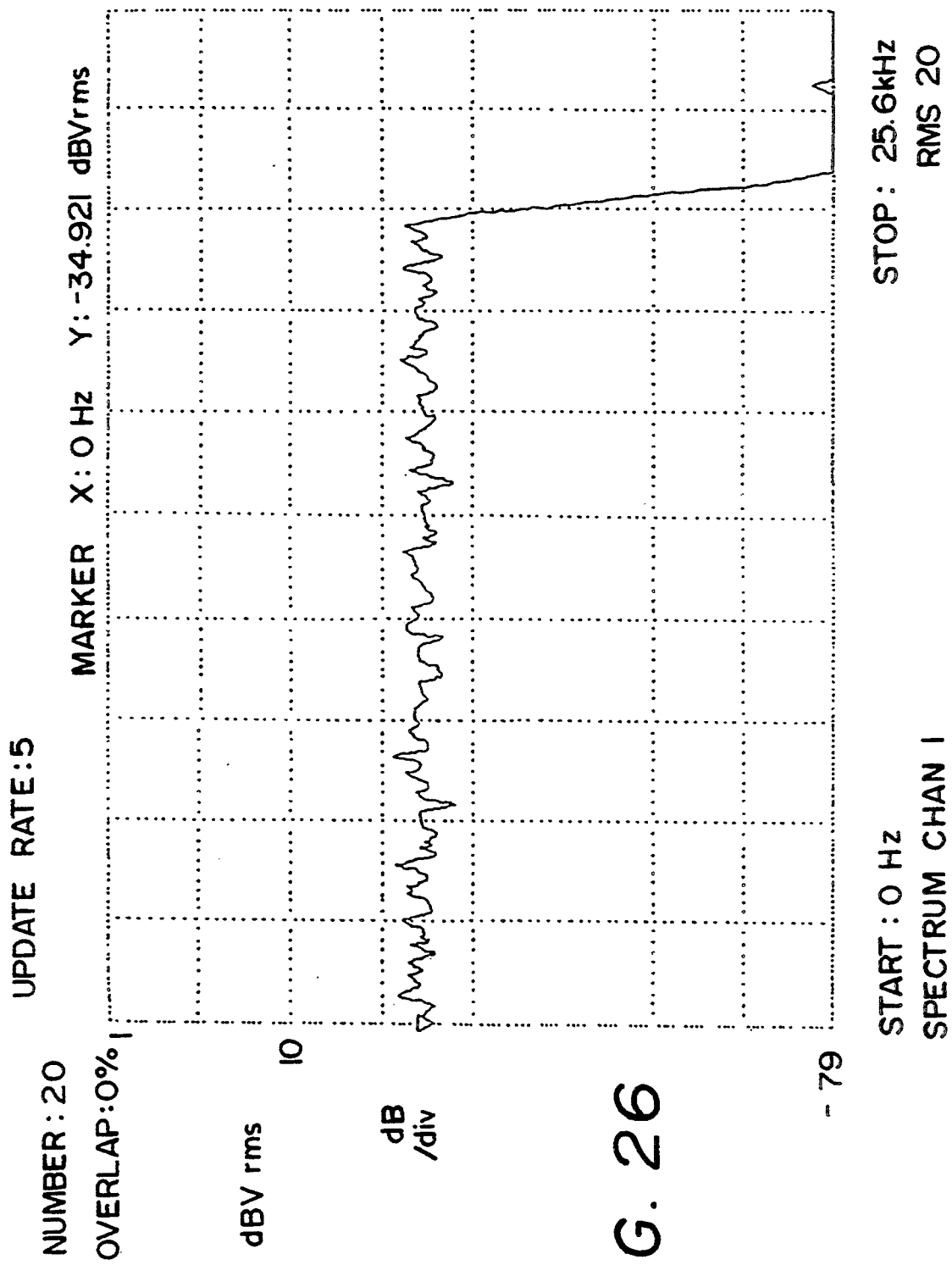

FIGS. 25 and 26 are graphs showing the frequency characteristics of the compact disc with or without the cut-outs, respectively. As in the embodiment of FIG. 7, the resulting frequency characteristic curve for the compact disc with the cut-outs is stable or flat as compared to the compact disc without such cut-outs. Accordingly, the formation of the compact disc in the manner as described above has the beneficial effect of improving the quality of sound to be reproduced.

The Inventor does not understand scientifically how and why the formation of such generally W-shaped and V-shaped cut-outs in the compact disc in the manner as described above results in a significant improvement in the quality of sound or image obtained therefrom. However, such beneficial results have indeed been attained through repeated experiments. Such experiments were made-using the following instruments or devices:

An FFT analyzer (YHP:35666A);
A compact disc containing a white noise signal,
Frequency range: 20 Hz to 20 KHz
Constant energy per 1 Hz
L+R effective value −20 dB
RMS 20 (average)
The results of the experiments are as follows:

TABLE

| Frequency Range | Difference Between Maximum and Minimum | | Difference | |
|---|---|---|---|---|
| | Without Cut-outs | With Cut-outs | dB | x |
| 0–2 KHz | 4.39 | 4.05 | 0.34 | 1.04 |
| 2–10 KHz | 6.89 | 4.05 | 2.84 | 1.39 |
| 10–20 KHz | 6.08 | 4.72 | 1.36 | 1.17 |
| 0–20 KHz | 6.89 | 4.72 | 2.17 | 1.28 |

From the graphs of FIGS. 25 and 26 and the Table above, it is apparent that the difference between the maximum and minimum values for the compact disc with the cut-outs is 4.72 dB. On the other hand, the difference between the maximum and minimum values for the compact disc without the cut-outs is 6.89 dB. Accordingly, the formation of the cut-outs in the disc results in a 2.17 dB reduction in the difference between the maximum and minimum values.

Figure 27:
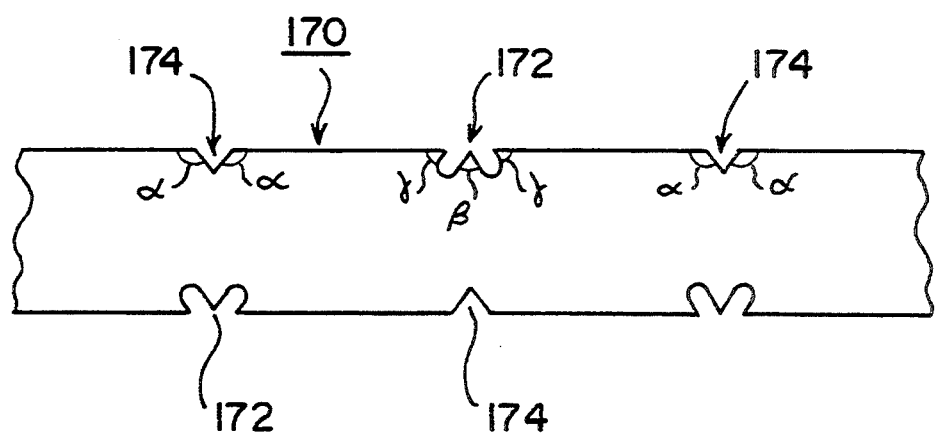
FIG. 27 is a plan view of a typical magnetic tape having a plurality of cut-outs in both sides thereof.

FIG. 27 is a fragmentary view of a magnetic tape 170 modified to have an alternation of generally W-shaped cut-outs 172 and generally V-shaped cut-outs 174 formed therein. As shown, the generally W-shaped cut-outs 172 and the generally V-shaped cut-outs 174 are arranged in both sides of the tape at a predetermined spacing. It should be noted that each of the generally W-shaped cut-out 172 in the upper side is aligned with each of the generally V-shaped cut-out 174 in the lower side. The transverse depth of each cut-out may be approximately 0.15 mm, and the predetermined spacing between adjacent cut-outs may be approximately 80 mm.

FIG. 28 is a plan view of an information storage card 180 such as a magnetic card or an IC card, which has been modified in accordance with the present invention. The card as shown is generally rectangular and includes a generally W-shaped cut-out 182 formed centrally in each side thereof, and a generally V-shaped cut-out 184 formed in each corner thereof, as in the previously described embodiments. It should be noted that the concept of this invention is equally applicable to other information storage media such as a floppy disc, a magnetic disc used in hard disc devices.

Although particular embodiments of the invention have been described in detail for purposes of illustration, various modifications may be made without departing from the spirit and scope of the invention. Accordingly, the invention is not to be limited except as by the appended claims.

What is claimed is:

1. A sheet member adapted for attachment to an acoustic or imaging instrument to improve the acoustic or imaging performance thereof, said sheet member being generally circular or polygonal in shape and including:
   a plurality of generally W-shaped cut-outs formed in the outer circumference of said sheet member; and
   a like plurality of generally V-shaped cut-outs formed in the outer circumference of said sheet member;
   said generally W-shaped cut-outs and said generally V-shaped cut-outs being arranged alternately and equi-angularly in the outer circumference of said sheet member.

2. The sheet member of claim 1 wherein each of said generally W-shaped cut-outs includes two indentations, each of which is defined by two sides merging with a bottom surface, said two indentations having their inner sides intersecting each other at a first predetermined acute angle, said two indentations having their outer sides intersecting the outer circumference of said sheet member at a second predetermined acute angle, each of said generally V-shaped cut-outs being defined by two sides merging with a bottom surface, each of the two sides of said generally V-shaped cut-outs intersecting the outer circumference of said sheet member at a third predetermined obtuse angle.

3. The sheet member of claim 2 wherein said first and second predetermined acute angles are between 55 and 65 degrees, and said third predetermined obtuse angle being between 115 and 125 degrees.

4. The sheet member of claim 1 further including:
a central opening;
a plurality of generally W-shaped cut-outs formed in the inner circumference of said sheet member; and
a like plurality of generally V-shaped cut-outs formed in the inner circumference of said sheet member;
said generally W-shaped cut-outs and said generally V-shaped cut-outs being arranged alternately and equi-angularly in the inner circumference of said sheet member.

5. The sheet member of claim 4 wherein each of said generally W-shaped cut-outs in the outer circumference of said sheet member is disposed in radial alignment with each of said generally V-shaped cut-outs in the inner circumference of said sheet member.

6. The sheet member of claim 4 wherein each of said generally W-shaped cut-outs formed in the inner circumference of said sheet member includes two indentations, each of which is defined by two sides merging with a bottom surface, said two indentations having their inner sides intersecting each other at a first predetermined acute angle, said two indentations having their outer side surfaces intersecting the inner circumference of said sheet member at a second predetermined acute angle, each of said generally V-shaped cut-outs being defined by two sides merging with a bottom surface, each of the two sides of said generally V-shaped cut-outs intersecting the inner circumference of said sheet member at-a third predetermined obtuse angle.

7. The sheet member of claim 6 wherein said first and second predetermined acute angles are between 55 and 65 degrees, and said third predetermined obtuse angle being between 115 and 125 degrees.

8. The sheet member of claim 6 wherein said sheet member further includes:
a like plurality of peripheral openings formed therein equi-angularly around said central opening;
a plurality of generally W-shaped cut-outs formed around each peripheral opening; and
a like plurality of generally V-shaped cut-outs formed around each peripheral opening;
said generally W-shaped cut-outs and said generally V-shaped cut-outs being arranged alternately and equi-angularly around each peripheral opening.

9. The sheet member of claim 4 wherein said sheet member is generally square in shape, and said central opening is also generally square in shape.

10. The sheet member of claim 4 wherein said sheet member is formed of paper, gold, silver, copper, titanium or other metals, syntheric resin, or cloth and has an adhesive backing.

11. The sheet member of claim 4 wherein said sheet member is adhesively attached to the front surface of a compact disc to reduce the emission of electromagnetic radiations therefrom to thereby improve the quality of sound to be reproduced.

12. The sheet member of claim 1 wherein said sheet member is generally rectangular in shape.

13. An electric cable having at least one cable conductor, at least one insulating layer surrounding said cable conductor, and at lease one sheath layer surrounding said insulating layer, the improvement comprising:
a plurality of sheet members disposed between said at least one insulating layer and said at least one sheath layer along the length of said electric cable to reduce the emission of electromagnetic radiations therefrom;

14. The electric cable of claim 13 wherein said at least one cable conductor is generally circular in cross section and including:
a plurality of generally W-shaped cut-outs extending along the length of said conductor;
a like plurality of generally V-shaped cut-outs extending along the length of said conductor;
said generally W-shaped cut-outs and said generally V-shaped cut-outs being arranged alternately and equi-angularly in the outer circumference of said conductor.

15. The electric cable of claim 13 wherein said at least one cable conductor is generally rhombic in cross section and including:
a generally W-shaped cut-out formed in each side surface of said conductor so as to extend along the length thereof;
a generally V-shaped cut-out formed in each corner of said conductor so as to extend along the length thereof.

16. The electric cable of claim 15 wherein said at least one cable conductor is generally tubular and has a generally rhombic inner circumference, said conductor including:
a generally W-shaped cut-out formed in each side surface of the inner circumference of said conductor so as to extend along the length thereof;
a generally V-shaped cut-out formed in each corner of the inner circumference of said conductor so as to extend along the length thereof.

17. The electric cable of claim 13 wherein said at least one cable conductor is comprised of a twisted copper wire and a twisted brass wire having a smaller diameter than, and covered by, said copper wire.

18. A circuit board adapted for mounting various circuit components thereon, said circuit board being generally rectangular in shape and including:
a plurality of generally W-shaped cut-outs formed in the outer circumference of said circuit board; and
a like plurality of generally V-shaped cut-outs formed in the outer circumference of said circuit board;
said generally W-shaped cut-outs and said generally V-shaped cut-outs being arranged in a predetermined manner in the outer circumference of said circuit board to reduce the interference caused by electromagnetic radiations from the various components on said circuit board.

19. The circuit board of claim 18 wherein each of said generally W-shaped cut-outs is formed centrally in each side of said circuit board, and each of said generally V-shaped cut-outs is formed in each corner of said circuit board.

20. The circuit board of claim 14 wherein said circuit board includes a generally square central opening;

a plurality of generally W-shaped cut-outs formed in the inner circumference of said circuit board; and a like plurality of generally V-shaped cut-outs formed in the inner circumference of said circuit board;

said generally W-shaped cut-outs and said generally V-shaped cut-outs being arranged in a predetermined manner in the inner circumference of said circuit board to reduce the interference caused by electromagnetic radiations from the various components on said circuit board.

21. A disc member adapted for storage and subsequent readout of analog or digital information, said disc including:

a plurality of generally W-shaped cut-outs formed in the outer circumference of said disc member; and a like plurality of generally V-shaped cut-outs formed in the outer circumference of said disc member;

said generally W-shaped cut-outs and said generally V-shaped cut-outs being arranged alternately and equi-angularly in the outer circumference of said disc member to reduce the interference caused by electromagnetic radiations from said disc member during the storage and readout of information thereon.

22. A tape member adapted for storage and subsequent readout of analog or digital information, said tape member including:

a plurality of generally W-shaped cut-outs formed in both sides of said tape member; and a like plurality of generally V-shaped cut-outs formed in both sides of said tape member;

said generally W-shaped cut-outs and said generally V-shaped cut-outs being arranged alternately at a predetermined spacing to reduce the interference caused. by electromagnetic radiations from said tape member during the storage and readout of information thereon.

23. The tape member of claim 22 wherein each of said generally W-shaped cut-outs in one side of said tape member is transversely aligned with each of said generally V-shaped cut-outs in the other side of said tape member, and each of said generally V-shaped cut-outs in the other side of said. tape member is transversely aligned with each of said generally W-shaped cut-outs in the one side of said tape member.

24. A semiconductor device having a package and a plurality of leads extending therefrom, said package being polygonal in shape and including:

a plurality of generally W-shaped cut-outs formed in the outer circumference of said package; and a like plurality of generally V-shaped cut-outs formed in the outer circumference of said package;

said generally W-shaped cut-outs and said generally V-shaped cut-outs being arranged alternately and equi-angularly in the outer circumference of said package to reduce the interference caused by electromagnetic radiations from said semiconductor device during its operation.

25. The semiconductor device of claim 24 wherein said package further includes:

at least one recess formed in a major surface of said package and including:

a plurality of generally W-shaped cut-outs formed around said at least one recess; and a like plurality of generally V-shaped cut-outs formed around said at least one recess;

said generally W-shaped cut-outs and said generally V-shaped cut-outs being arranged alternately and equi-angularly around said at least one recess to reduce the interference caused by electromagnetic radiations from said semiconductor device during its operation.

26. The semiconductor of claim 24 wherein said package is generally square in shape and including:

a generally W-shaped cut-out formed in each side surface of said package; and a generally V-shaped cut-out formed in each corner of said package.

27. A memory card adapted for storage and subsequent readout of digital information, said memory card being generally rectangular in shape and including:

a generally W-shaped cut-out formed in each side surface of said card; and a generally V-shaped cut-out formed in each corner of said card;

said generally W-shaped cut-outs and said generally V-shaped cut-outs being formed in a predetermined manner to reduce the interference caused by electromagnetic radiations from said memory card during the storage and readout of digital information.

28. A method of improving the acoustic performance of an acoustic instrument, comprising the steps of:

providing a plurality of annular sheet members, each of said sheet members including a plurality of generally W-shaped cut-outs and a like plurality of generally V-shaped cut-outs formed alternately and equi-angularly in the inner and outer circumferences of the annular sheet member;

attaching said plurality of annular sheet members adhesively to said acoustic instrument; and adjusting the location for attachment of said annular sheet members to optimize the acoustic performance of said acoustic instrument.

* * * * *